(12) United States Patent
Bae et al.

(10) Patent No.: US 9,291,841 B2
(45) Date of Patent: Mar. 22, 2016

(54) DISPLAY DEVICE AND METHOD OF MANUFACTURING THE SAME

(71) Applicant: Samsung Display Co., Ltd., Yongin, Gyeonggi-do (KR)

(72) Inventors: Joo-Han Bae, Seongnam-si (KR); Dong Hyun Yu, Gwacheon-si (KR); Hyung-Il Jeon, Incheon-si (KR)

(73) Assignee: Samsung Display Co., Ltd. (KR)

( * ) Notice: Subject to any disclaimer, the term of this patent is extended or adjusted under 35 U.S.C. 154(b) by 211 days.

(21) Appl. No.: 14/026,917

(22) Filed: Sep. 13, 2013

(65) Prior Publication Data
US 2014/0184974 A1    Jul. 3, 2014

(30) Foreign Application Priority Data

Dec. 31, 2012  (KR) .......................... 10-2012-0158590

(51) Int. Cl.
| | |
|---|---|
| G02F 1/1333 | (2006.01) |
| G02F 1/1335 | (2006.01) |
| H01L 27/12 | (2006.01) |
| G02F 1/1339 | (2006.01) |
| G02F 1/1345 | (2006.01) |

(52) U.S. Cl.
CPC ........ *G02F 1/133305* (2013.01); *G02F 1/1339* (2013.01); *G02F 1/13458* (2013.01); *G02F 1/133377* (2013.01); *H01L 27/1248* (2013.01); *G02F 2001/133368* (2013.01)

(58) Field of Classification Search
CPC ................... G02F 1/133305; G02F 1/133377; G02F 1/1339; G02F 1/13458; G02F 2001/133368; H01L 27/1248

USPC .................................... 349/86, 106, 122, 138
See application file for complete search history.

(56) References Cited

U.S. PATENT DOCUMENTS

| | | | | |
|---|---|---|---|---|
| 5,386,307 | A | * | 1/1995 | Jang ...................... G02F 1/1347 349/122 |
| 6,141,072 | A | * | 10/2000 | Drabik ................ G02F 1/13394 216/23 |
| 6,747,800 | B1 | | 6/2004 | Lin |
| 7,123,319 | B2 | | 10/2006 | Broer et al. |
| 7,623,287 | B2 | | 11/2009 | Sasagawa et al. |
| 2006/0146267 | A1 | | 7/2006 | Choi et al. |
| 2012/0062448 | A1 | * | 3/2012 | Kim .................. G02F 1/133377 345/55 |

FOREIGN PATENT DOCUMENTS

| | | |
|---|---|---|
| JP | 2000-330130 | 11/2000 |
| KR | 10-2014-0025739 | 3/2014 |

* cited by examiner

*Primary Examiner* — Nathanael R Briggs
(74) *Attorney, Agent, or Firm* — Innovation Counsel LLP

(57) ABSTRACT

A display device is provided. The display device includes a substrate including a pixel region, a thin film transistor formed on the substrate, a light blocking member formed at a boundary of the pixel region, and a pixel electrode formed in the pixel region, the pixel electrode connected to the thin film transistor. The display device also includes a common electrode formed on the light blocking member, the common electrode spaced apart from the pixel electrode with a microcavity interposed between the common electrode and the pixel electrode, and a roof layer comprising a color filter formed on the common electrode. The display device further includes an opening formed in the common electrode and the roof layer to expose a portion of the microcavity, a liquid crystal filling the microcavity, and an overcoat formed on the roof layer to cover the opening and seal the microcavity for each pixel region.

14 Claims, 31 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2012-0158590 filed in the Korean Intellectual Property Office on Dec. 31, 2012, the entire contents of which are incorporated herein by reference.

BACKGROUND (a) Field

The present disclosure relates to a display device and a method of manufacturing the same.

(b) Description of the Related Art

A liquid crystal display is commonly used in flat panel displays. The liquid crystal display includes two display panels on which field generating electrodes (e.g., a pixel electrode and a common electrode) are formed and a liquid crystal layer interposed therebetween. To display an image on the liquid crystal display, a voltage is first applied to the field generating electrodes to generate an electric field to manipulate the alignment of liquid crystal molecules in the liquid crystal layer, so as to control polarization of incident light.

The two display panels in the liquid crystal display may include a thin film transistor array panel and a counter display panel. In the thin film transistor array panel, a gate line for transferring a gate signal and a data line for transferring a data signal may be formed crossing each other. A thin film transistor may be formed connected to the gate line and the data line, and a pixel electrode may be formed connected to the thin film transistor. A light blocking member, a color filter, and a common electrode may be formed in the counter display panel. In some cases, the light blocking member, the color filter, and the common electrode may be formed in the thin film transistor array panel.

In a conventional liquid crystal display device, the two display panels are typically formed on different substrates. For example, a first substrate is used for the thin film transistor array panel, and a second substrate is used for the counter display panel. However, using two different substrates for the display panels can increase the weight and form factor of the conventional liquid crystal display device, and increase process costs and turn-around time.

SUMMARY

The present disclosure is directed to address at least the above problems in the related art, by providing a display device that can be manufactured using a single substrate.

According to some embodiments of the present inventive concept, a display device is provided. The display device includes a substrate including a pixel region; a thin film transistor formed on the substrate; a light blocking member formed at a boundary of the pixel region; a pixel electrode formed in the pixel region, the pixel electrode connected to the thin film transistor; a common electrode formed on the light blocking member, the common electrode spaced apart from the pixel electrode with a microcavity interposed between the common electrode and the pixel electrode; a roof layer formed on the common electrode, the roof layer comprising a color filter; an opening formed in the common electrode and the roof layer to expose a portion of the microcavity; a liquid crystal filling the microcavity; and an overcoat formed on the roof layer to cover the opening and seal the microcavity for each pixel region.

In some embodiments, the display device may include a gate line and a data line formed on the substrate and connected to the thin film transistor; a gate pad connected to the gate line; a first auxiliary gate pad formed on the gate pad; a data pad connected to the data line; and a first auxiliary data pad formed on the data pad.

In some embodiments, the gate pad may be formed of a same material as the gate line, and the data pad may be formed of a same material as the data line.

In some embodiments, the first auxiliary gate pad and the first auxiliary data pad may be formed of a same material as the pixel electrode.

In some embodiments, the display device may include a second auxiliary gate pad formed on the first auxiliary gate pad, and a second auxiliary data pad formed on the first auxiliary data pad.

In some embodiments, the second auxiliary gate pad and the second auxiliary data pad may be formed of a same material as the common electrode.

According to some other embodiments of the present inventive concept, a method of manufacturing a display device is provided. The method includes forming a thin film transistor on a substrate, the substrate including a pixel region; forming a light blocking member at a boundary of the pixel region; forming a pixel electrode in the pixel region, the pixel electrode connected to the thin film transistor; forming a sacrificial layer on the pixel electrode and the light blocking member; ashing the sacrificial layer; forming a common electrode on the sacrificial layer and the light blocking member; forming a roof layer on the common electrode, the roof layer comprising a color filter; forming an opening in the common electrode and the roof layer; forming a microcavity by removing the sacrificial layer through the opening; injecting a liquid crystal to fill the microcavity through the opening; and forming an overcoat to seal the opening.

In some embodiments, the method may include forming a gate line on the substrate; forming a gate insulating layer on the gate line; forming a data line on the gate insulating layer; and forming a passivation layer on the data line, wherein a portion of the thin film transistor is connected to the gate line, and another portion of the thin film transistor is connected to the data line.

In some embodiments, the method may include forming a gate pad connected to the gate line; forming the gate insulating layer on the gate pad; forming a data pad connected to the data line; and forming the passivation layer on the data pad.

In some embodiments, the gate pad may be formed of a same material as the gate line, and the data pad may be formed of a same material as the data line.

In some embodiments, the method may include patterning the passivation layer and the gate insulating layer to remove a portion of the gate insulating layer and a portion of the passivation layer positioned on the gate pad and another portion of the passivation layer positioned on the data pad, so as to expose the gate pad and the data pad; and forming a first auxiliary gate pad on the exposed gate pad and forming a first auxiliary data pad on the exposed data pad.

In some embodiments, the first auxiliary gate pad and the first auxiliary data pad may be formed of a same material as the pixel electrode.

In some embodiments, the method may include removing a portion of the sacrificial layer positioned on each of the first auxiliary gate pad and the first auxiliary data pad by patterning the sacrificial layer.

In some embodiments, the method may include forming a second auxiliary gate pad on the first auxiliary gate pad and forming a second auxiliary data pad on the first auxiliary data pad, wherein the second auxiliary gate pad and the second auxiliary data pad may be formed in a same process step as the common electrode.

In some embodiments, the second auxiliary gate pad and the second auxiliary data pad may be formed of a same material as the common electrode.

In some embodiments, the method may include forming a first insulating layer on the pixel electrode and the light blocking member, and removing a portion of the first insulating layer positioned on each of the first auxiliary gate pad and the first auxiliary data pad.

In some embodiments, the method may include forming a second insulating layer on the common electrode, the second auxiliary gate pad, and the second auxiliary data pad; forming a third insulating layer on the roof layer and the second insulating layer; and removing a portion of the second insulating layer and the third insulating layer positioned on each of the second auxiliary gate pad and the second auxiliary data pad by patterning the second insulating layer and the third insulating layer.

In some embodiments, the method may include forming the common electrode on the gate pad and the data pad; forming the second insulating layer on the common electrode; and forming the third insulating layer on the roof layer and the second insulating layer.

In some embodiments, the method may include removing a portion of the common electrode, the second insulating layer, and the third insulating layer positioned on each of the first auxiliary gate pad and the second auxiliary data pad by patterning the common electrode, the second insulating layer, and the third insulating layer.

In some embodiments, ashing the sacrificial layer may further include removing a portion of the sacrificial layer positioned on the light blocking member.

DETAILED DESCRIPTION OF THE EMBODIMENTS

Figure 1:
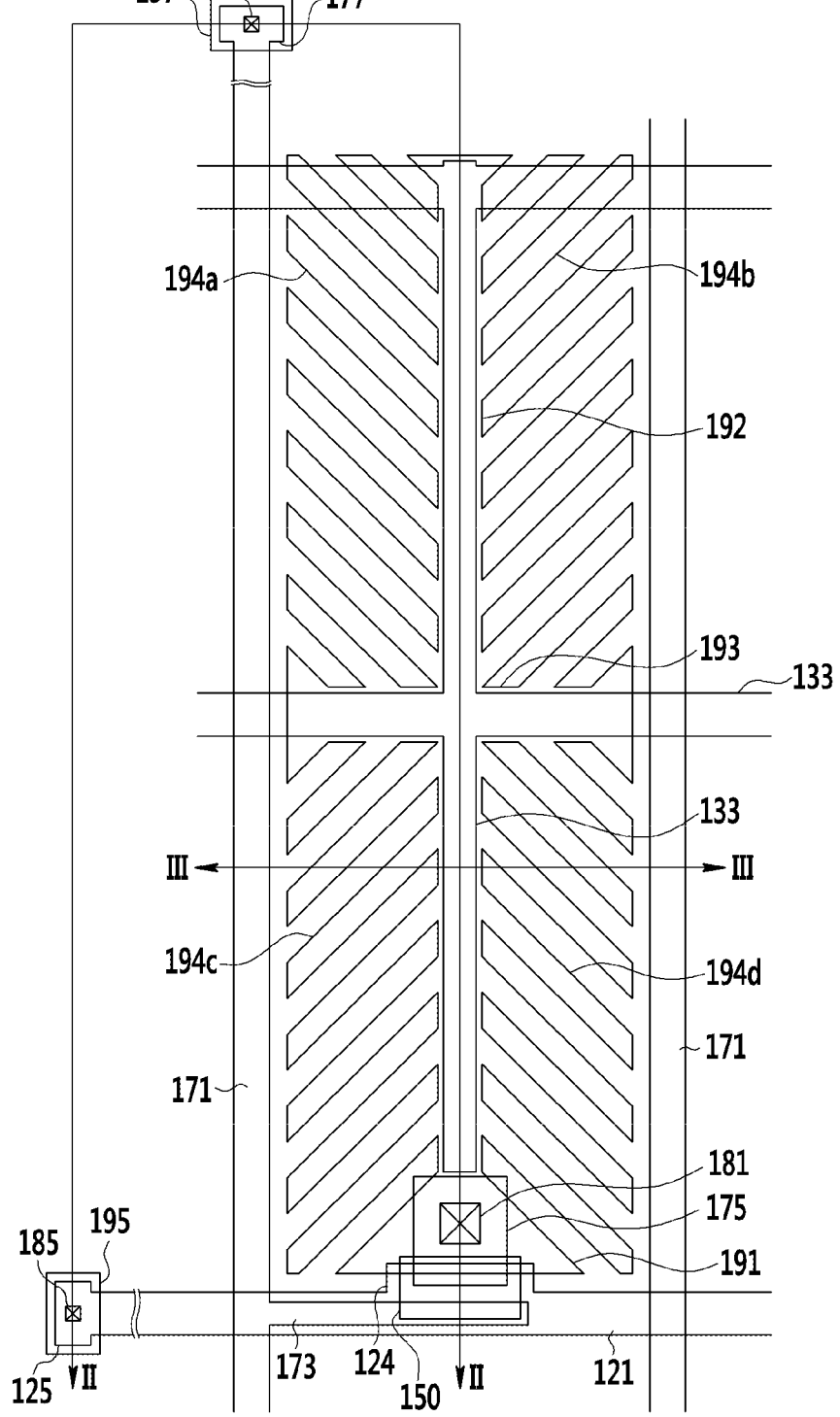
FIG. 1 is a top plan view illustrating a display device according to an exemplary embodiment of the present inventive concept.

The present inventive concept will be described more fully hereinafter with reference to the accompanying drawings, in which exemplary embodiments of the inventive concept are shown. As those skilled in the art would realize, the described embodiments may be modified in various ways without departing from the spirit or scope of the present disclosure.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, the element can be directly formed on the other element, or formed with intervening elements present. In contrast, when an element is referred to as being "directly on" another element, the element is formed directly on the other element without any intervening element.

First, a display device according to an exemplary embodiment of the present inventive concept will be described below with reference to FIGS. 1 to 3.

FIG. 1 is a top plan view illustrating a display device according to an exemplary embodiment of the present inventive concept. FIG. 2 is a cross-sectional view of the display device taken along line II-II of FIG. 1. FIG. 3 is a cross-sectional view of the display device taken along line III-III of FIG. 1.

With reference to FIG. 1, the display device includes a plurality of gate lines 121 and data lines 171 formed extending in different directions on a substrate 110. For example, the gate lines 121 are formed extending in a substantially horizontal direction on the substrate 110, and the data lines 171 are formed extending in a substantially vertical direction on the substrate 110. The substrate 110 may be formed of a material such as glass or plastic. The gate lines 121 and the data lines 171 may be formed crossing each other (i.e., perpendicular to each other).

The display device of FIG. 1 includes a plurality of pixel regions. The plurality of pixel regions may be defined by the gate lines 121 crossing the data lines 171.

A gate signal is transferred through a gate line 121. A gate electrode 124 is formed protruding from the gate line 121, and a gate pad 125 is formed connected to the gate line 121. As shown in FIG. 1, the gate pad 125 is formed connected to an end of the gate line 121. A width of the gate pad 125 may be greater than a width of the gate line 121.

The gate pad 125 receives an external gate signal and transfers the gate signal to the gate line 121, which then applies the gate signal to the gate electrode 124.

A storage electrode 133 may be formed in the pixel region, the storage electrode 133 being spaced apart from the gate line 121 and gate electrode 124. As shown in FIG. 1, the storage electrode 133 may be formed in a direction that is parallel to the gate line 121 and the data line 171. In some other embodiments, the storage electrode 133 may be formed in a direction that is parallel to the gate line 121. A plurality of storage electrodes 133 may be formed in adjacent pixel regions, with the storage electrodes 133 connected to each other. A predetermined voltage (for example a common voltage) is applied to the storage electrode(s) 133.

Figure 2:
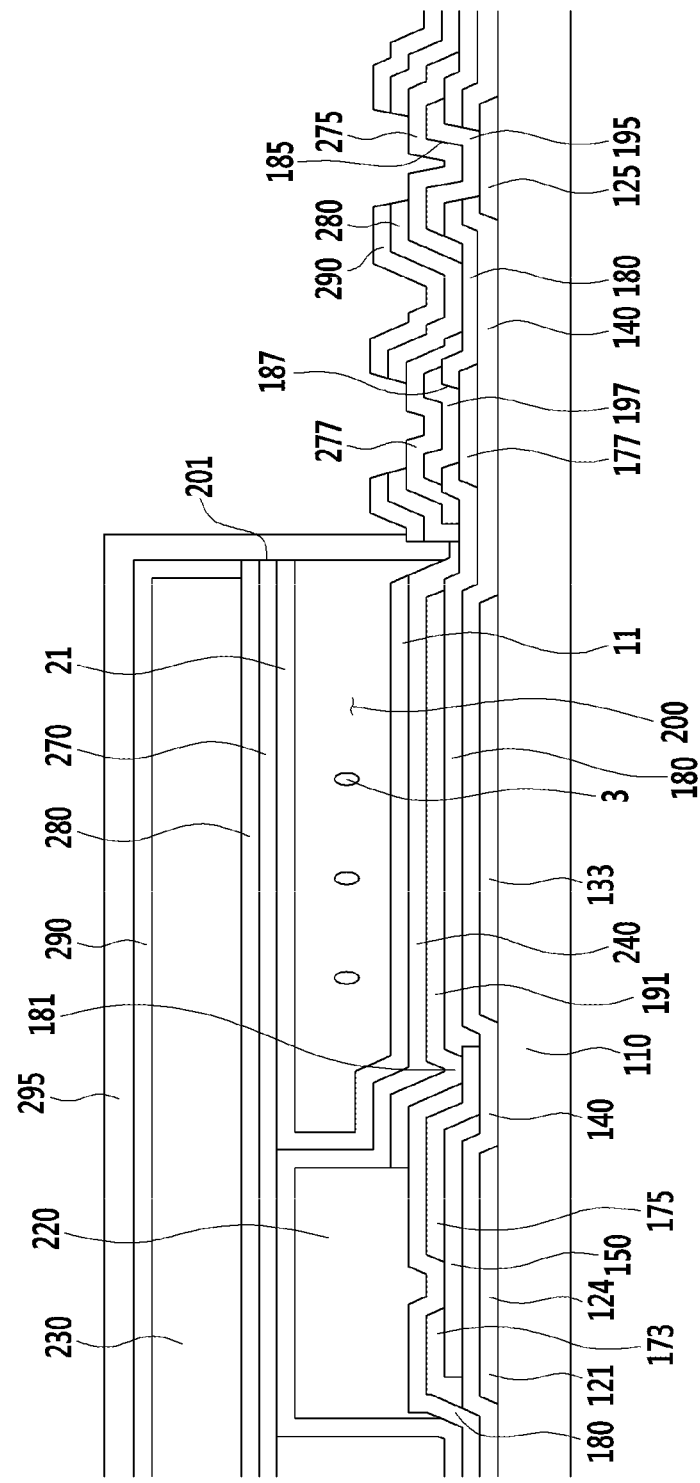
FIG. 2 is a cross-sectional view of the display device taken along line II-II of FIG. 1.

Referring to FIG. 2, a gate insulating layer 140 is formed on the gate line 121, gate electrode 124, and storage electrode 133. The gate insulating layer 140 may be formed of an inorganic insulating material (such as silicon nitride (SiNx) or silicon oxide (SiOx)). In some embodiments, the gate insulating layer 140 may be formed as a single layer. In some other embodiments, the gate insulating layer 140 may be formed as a multilayer including two or more different insulating layers (not illustrated).

As shown in FIG. 2, a semiconductor layer 150 is formed on the gate insulating layer 140. The semiconductor layer 150 may be positioned on (or above) the gate electrode 124. Referring back to FIG. 1, the semiconductor layer 150 is formed extending to a lower portion of the data line 171. The semiconductor layer 150 may be formed of amorphous silicon, polycrystalline silicon, metal oxide, or other semiconductor materials.

With reference to FIG. 2, a source electrode 173 and a drain electrode 175 are formed on the semiconductor layer 150. The source electrode 173 is formed protruding from the data line 171. The drain electrode 175 is formed being spaced apart from the source electrode 173. A data pad 177 is formed connected to the data line 171. For example, the data pad 177 may be formed connected to an end of the data line 171. A width of the data pad 177 may be greater than a width of the data line 171.

A data signal is transferred through the data line 171. The data pad 177 receives an external data signal and transfers the data signal to the data line 171, which then applies the data signal to the source electrode 173.

The gate electrode 124, semiconductor layer 150, source electrode 173, and drain electrode 175 collectively constitute a thin film transistor. When the thin film transistor is switched to an on-state, the data signal applied to the source electrode 173 is transferred to the drain electrode 175.

The gate electrode 124 (constituting a portion of the thin film transistor) is connected to the gate line 121, and the source electrode 173 (constituting another portion of the thin film transistor) is connected to the data line 171.

Figure 3:
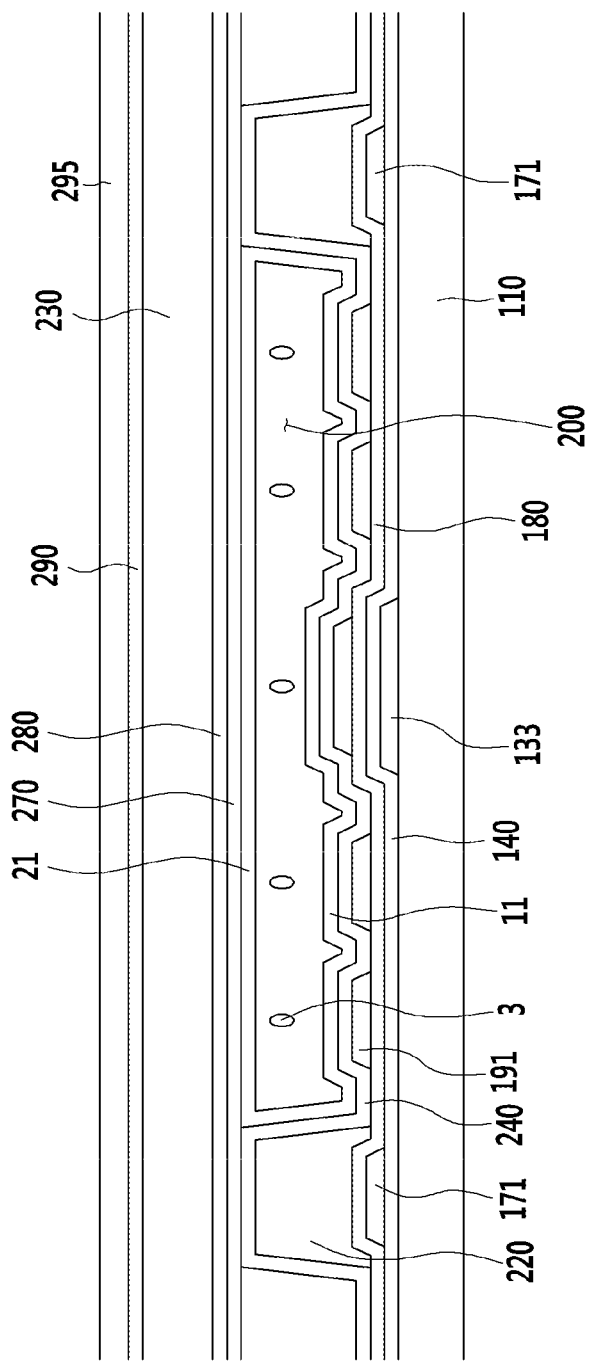
FIG. 3 is a cross-sectional view of the display device taken along line III-III of FIG. 1.

Referring to FIGS. 2 and 3, a passivation layer 180 is formed on the data line 171, source electrode 173, drain electrode 175, and an exposed portion of the semiconductor layer 150 between the source electrode 173 and drain electrode 175. In some embodiments, the passivation layer 180 may be formed of an organic insulating material. In other embodiments, the passivation layer 180 may be formed of an inorganic insulating material. Also, in some embodiments, the passivation layer 180 may be formed as a single layer. In some other embodiments, the passivation layer 180 may be formed as a multilayer.

With reference to FIGS. 2 and 3, a light blocking member 220 is formed on the passivation layer 180 at a boundary of the pixel region. The light blocking member 220 may be formed as a partition wall surrounding the pixel region. The light blocking member 220 may be formed on the thin film transistor. The light blocking member 220 is formed of a light-blocking material for reducing light leakage.

A first contact hole 181 (through which a portion of the drain electrode 175 is exposed) is formed in the passivation layer 180. In some particular embodiments, the light blocking member 220 is formed on a portion of the thin film transistor, and need not be formed around the first contact hole 181.

The pixel electrode 191 is formed on the passivation layer 180, and the pixel electrode 191 is connected to the drain electrode 175 through the first contact hole 181. In some particular embodiments, the pixel electrode 191 need not overlap with the light blocking member 220.

The present inventive concept is not limited to the above-described embodiments. For example, in some other embodiments, the light blocking member 220 may be formed covering the thin film transistor; the first contact hole 181 may be formed in the light blocking member 220; and/or a portion of the pixel electrode 191 may be formed overlapping with the light blocking member 220.

The pixel electrode 191 is formed in each pixel region, and is connected to the drain electrode 175 to receive the data signal from the drain electrode 175 when the thin film transistor is switched to an on-state. The pixel electrode 191 may be formed of a transparent metal material (such as indium-tin oxide (ITO) and indium-zinc oxide (IZO)).

With reference to FIG. 1, the pixel electrode 191 includes a horizontal stem portion 193, a vertical stem portion 192 that is formed orthogonal to the horizontal stem portion 193, and a plurality of fine branch portions. The plurality of fine branch portions include first fine branch portions 194a, second fine branch portions 194b, third fine branch portions 194c, and fourth fine branch portions 194d.

The horizontal stem portion 193 may be formed in a direction that is parallel to the gate line 121, and the vertical stem portion 192 may be formed in a direction that is parallel to the data line 171. The horizontal stem portion 193 may be formed at approximately an intermediate position between the two adjacent gate lines 121, and the vertical stem portion 192 may be formed at approximately an intermediate position between the two adjacent data lines 171.

A pixel region is divided by the horizontal stem portion 193 and the vertical stem portion 192 into a first sub-pixel region, a second sub-pixel region, a third sub-pixel region, and a fourth sub-pixel region. Referring to FIG. 1, the first sub-pixel region is positioned in an upper-left portion of the pixel region (on a left side of the horizontal stem portion 193 and an upper side of the vertical stem portion 192), and the second sub-pixel region is positioned in an upper-right portion of the pixel region (on a right side of the horizontal stem portion 193 and an upper side of the vertical stem portion 192). The third sub-pixel region is positioned in a lower-left portion of the pixel region (on the left side of the horizontal stem portion 193 and a lower side of the vertical stem portion 192), and the fourth sub-pixel region is positioned in a lower-right portion of the pixel region (on the right side of the horizontal stem portion 193 and a lower side of the vertical stem portion 192).

The first fine branch portion 194a is formed in the first sub-pixel region, and the second fine branch portion 194b is formed in the second sub-pixel region. The third fine branch portion 194c is formed in the third sub-pixel region, and the fourth fine branch portion 194d is formed in the fourth sub-pixel region.

The first fine branch portion 194a is formed extending obliquely in an upper left direction from the horizontal stem portion 193 or the vertical stem portion 192, and the second fine branch portion 194b is formed extending obliquely in an upper right direction from the horizontal stem portion 193 or the vertical stem portion 192. The third fine branch portion 194c is formed extending obliquely in a lower left direction from the horizontal stem portion 193 or the vertical stem portion 192, and the fourth fine branch portion 194d is formed extending obliquely in a lower right direction from the horizontal stem portion 193 or the vertical stem portion 192.

Each of the first to fourth fine branch portions 194a, 194b, 194c, and 194d may be formed having an angle of about 45° or 135° to either the gate line 121 or the horizontal stem portion 193. The first to fourth fine branch portions 194a, 194b, 194c, and 194d of the adjacent sub-pixel regions may be formed orthogonal to one another. For example, the first fine branch portions 194a may be formed orthogonal to the second fine branch portions 194b, and the third fine branch portions 194c may be formed orthogonal to the fourth fine branch portions 194d.

The shape of the pixel electrode 191 illustrated in FIG. 1 is not limited to the above-described configuration, and can be modified in different ways. For example, in some embodiments, the pixel region is divided into more than four sub-pixel regions. In some particular embodiments, the pixel region need not be divided into a plurality of sub-pixel regions.

With reference to FIGS. 1 and 2, a first auxiliary gate pad 195 and a first auxiliary data pad 197 may be formed on a same layer as the pixel electrode 191. The first auxiliary gate pad 195 and first auxiliary data pad 197 may be formed of the same material as the pixel electrode 191.

As shown in FIG. 2, the first auxiliary gate pad 195 may be formed on the gate pad 125. First, a gate insulating layer 140 and a passivation layer 180 are formed on the gate pad 125. A second contact hole 185 (through which at least a portion of the gate pad 125 is exposed) is formed in the gate insulating layer 140 and passivation layer 180. The first auxiliary gate pad 195 is formed in the second contact hole 185, and is connected to the gate pad 125 through the second contact hole 185. As shown in FIG. 2, a portion of the first auxiliary gate pad 195 may be formed on the passivation layer 180, and another portion of the first auxiliary gate pad 195 may be formed directly on the gate pad 125.

As shown in FIG. 2, the first auxiliary data pad 197 may be formed on the data pad 177. First, the gate insulating layer 140 and passivation layer 180 are formed on the data pad 177. A third contact hole 187 (through which at least a portion of the data pad 177 is exposed) is formed in the gate insulating layer 140 and passivation layer 180. The first auxiliary data pad 197 is formed in the third contact hole 187, and is connected to the data pad 177 through the third contact hole 187. A portion of the first auxiliary data pad 197 may be formed on the passivation layer 180, and another portion of the first auxiliary data pad 197 may be formed directly on the data pad 177.

Since the gate pad 125 and the data pad 177 may each receive an external signal, a portion of the respective upper surface of the gate pad 125 and data pad 177 may be exposed to contact with an external terminal. However, if the surfaces of the gate pad 125 and data pad 177 are not protected, oxidation of the gate pad 125 and data pad 177 may occur, thereby causing electrical contact issues. As described above, the first auxiliary gate pad 195 and first auxiliary data pad 197 may be formed respectively on the gate pad 125 and data pad 177. By including a protective metal oxide in the first auxiliary gate pad 195 and first auxiliary data pad 197, the gate pad 125 and data pad 125 can be protected from further oxidation, thereby mitigating electrical contact issues.

Referring to FIG. 2, a first insulating layer 240 may be formed on the light blocking member 220 and pixel electrode 191. The first insulating layer 240 may be formed of an inorganic insulating material (such as silicon nitride (SiNx) or silicon oxide (SiOx)). The first insulating layer 240 may serve several functions. For example, the first insulating layer 240 can act as a protective layer for the light blocking member 220 (the light blocking member 220 being formed of an organic material). The first insulating layer 240 can also prevent the pixel electrode 191 (which is formed of conductive metal) from shorting with another metal layer. Nevertheless, in some particular embodiments, the first insulating layer 240 may be omitted.

In some embodiments, the first insulating layer 240 need not be formed on the first auxiliary gate pad 195 and first auxiliary data pad 197. See, e.g., FIG. 2.

Referring to FIGS. 2 and 3, a common electrode 270 is formed on the light blocking member 220 and pixel electrode 191. In some embodiments, the common electrode 270 may also be formed on the first insulating layer 240.

As shown in FIGS. 2 and 3, the common electrode 270 is formed being spaced apart from the pixel electrode 191 with a microcavity 200 interposed therebetween. The pixel electrode 191 and common electrode 270 may be spaced apart from each other at a predetermined interval. In some embodiments, the predetermined interval between the pixel electrode 191 and common electrode 270 may be substantially the same as a height of the light blocking member 220. A width and an area of the microcavity 200 may be modified in various ways according to the desired resolution of the display device.

The common electrode 270 may be formed of a transparent metal material (such as indium-tin oxide (ITO) or indium-zinc oxide (IZO)). A predetermined voltage may be applied to the common electrode 270 to create an electric field between the pixel electrode 191 and common electrode 270.

A second auxiliary gate pad 275 and a second auxiliary data pad 277 may be formed of the same layer as the common electrode 270. Therefore, the second auxiliary gate pad 275 and second auxiliary data pad 277 may be formed of the same material as the common electrode 270.

The second auxiliary gate pad 275 may be formed on the first auxiliary gate pad 195 covering the first auxiliary gate pad 195. Also, a portion of the second auxiliary gate pad 275 may be formed on the passivation layer 180, and another portion of the second auxiliary gate pad 275 may be formed directly on the first auxiliary gate pad 195.

The second auxiliary data pad 277 may be formed on the first auxiliary data pad 197 covering the first auxiliary data pad 197. A portion of the second auxiliary data pad 277 may be formed on the passivation layer 180, and another portion of the second auxiliary data pad 277 may be formed directly on the first auxiliary data pad 197.

In some embodiments, a portion of the second auxiliary gate pad 275 and a portion of the second auxiliary data pad 277 may be formed on the first insulating layer 240.

As shown in FIGS. 2 and 3, a liquid crystal 3 fills the microcavity 200 between the pixel electrode 191 and common electrode 270. The liquid crystal 3 includes a plurality of liquid crystal molecules. When an electric field is not applied to the liquid crystal 3, the liquid crystal molecules may be oriented in a direction that is perpendicular to the surface of substrate 110. When an electric field is applied to the liquid crystal 3, the liquid crystal molecules may be oriented in a direction that is parallel to the surface of the substrate 110. Thus, the liquid crystal molecules can be aligned in different ways by manipulating the electric field applied to the liquid crystal 3.

The liquid crystal 3 may be formed of any one of nematic, smetic, cholesteric, and chiral liquid crystal materials. In some embodiments, the liquid crystal 3 may be formed of a negative type liquid crystal material. In some other embodiments, the liquid crystal 3 may be formed of a positive type liquid crystal material.

In the above-described embodiments, the pixel electrode 191 is formed beneath the microcavity 200 and the common electrode 270 is formed above the microcavity 200. Nevertheless, the present inventive concept is not limited to the above-described configuration. For example, in some particular embodiments, both the pixel electrode 191 and common electrode 270 may be formed beneath the microcavity 200. In those particular embodiments, the pixel electrode 191 and common electrode 270 may either be formed on a same layer, or formed on different layers with one or more insulating layers interposed therebetween. In those particular embodiments, the liquid crystal 3 may be formed in the microcavity 200 with the liquid crystal molecules oriented in a direction that is parallel to the surface of the substrate 110.

A first alignment layer 11 is formed on the pixel electrode 191. In some embodiments, the first alignment layer 11 may be formed on the first insulating layer 240. See, e.g., FIGS. 2 and 3.

A second alignment layer 21 is formed under the common electrode 270, the second alignment layer 21 facing the first alignment layer 11.

The first alignment layer 11 and second alignment layer 21 may be formed as a vertical alignment layer, and may be formed of a material such as polyamic acid, polysiloxane, or polyimide. The first alignment layer 11 and second alignment layer 21 may be connected to each other at an edge of the pixel region. In other words, the first alignment layer 11 and second alignment layer 21 may be formed on a lateral surface of the light blocking member 220 that is in contact with the microcavity 200.

The microcavity 200 is surrounded by the first insulating layer 240 and common electrode 270. The common electrode 270 may be formed in contact with an upper portion of the first insulating layer 240 (where the first insulating layer 240 overlaps with the data line 171). A plurality of common electrodes 270 may be formed connected along pixel regions adjacent in a row direction.

Since the common electrode 270 is not formed at a boundary of a portion of the pixel region, a portion of the microcavity 200 may be exposed. For example, since the common electrode 270 is not formed at a boundary of the pixel regions adjacent in a column direction, an opening 201 may be formed exposing a portion of the microcavity 200. The opening 201 may be formed at the boundary of pixel regions adjacent in a column direction. The liquid crystal 3 can be injected into the microcavity 200 through the opening 201.

In the above-described embodiments, the common electrodes 270 are formed connected along pixel regions adjacent in a row direction, and the opening 201 is formed at the boundary of pixel regions adjacent in a column direction. Nevertheless, the present inventive concept is not limited to the above-described configuration. For example, in some other embodiments, the common electrodes 270 may be formed connected along pixel regions adjacent in a column direction, and the opening 201 may be formed at the boundary of pixel regions adjacent in a row direction.

A second insulating layer 280 may be formed on the common electrode 270. The second insulating layer 280 may be formed of an inorganic insulating material (such as silicon nitride (SiNx) or silicon oxide (SiOx)). In some particular embodiments, the second insulating layer 280 may be omitted.

With reference to FIGS. 2 and 3, a roof layer 230 is formed in each pixel region on the common electrode 270. The roof layer 230 may include a color filter. The roof layer 230 may be formed of an organic material. In some embodiments, the roof layer 230 may be formed on the second insulating layer 280.

The color filter in the roof layer 230 may be formed of an organic material capable of displaying any one of the three primary colors red, green, and blue. The color filter need not be limited to the three primary colors. For example, in some other embodiments, the color filter may display cyan, magenta, yellow, white-based colors, or other colors.

The microcavity 200 is formed under the roof layer 230, and the shape of the microcavity 200 may be maintained by the roof layer 230. An opening 201 is formed in the roof layer 230 to expose a portion of the microcavity 200.

Referring to FIGS. 2 and 3, a third insulating layer 290 may be formed on the roof layer 230. The third insulating layer 290 may be formed of an inorganic insulating material (such as silicon nitride (SiNx) or silicon oxide (SiOx)). The third insulating layer 290 may be formed covering an upper surface and a lateral surface of the roof layer 230. The third insulating layer 290 can act as a protective layer for the roof layer 230. In some particular embodiments, the third insulating layer 290 may be omitted.

Referring again to FIGS. 2 and 3, an overcoat 295 may be formed on the third insulating layer 290. The overcoat 295 is formed covering the opening 201 (through which a portion of the microcavity 200 is exposed). Thus, the overcoat 295 may seal the opening 201, so that the liquid crystal 3 in the microcavity 200 is not discharged to the outside. Since the overcoat 295 is in contact with the liquid crystal 3, it is preferable that the overcoat be formed of a material that does not react with the liquid crystal 3. For example, the overcoat 295 may be formed of parylene or other similar materials.

The overcoat 295 may be formed as a multilayer (for example, a double layer or a triple layer). A double layer includes two layers formed of different materials. A triple layer includes three layers, wherein adjacent layers are formed of different materials. In some embodiments, the overcoat 295 may include a layer formed of an organic insulating material and a layer formed of an inorganic insulating material.

In some embodiments, the second insulating layer 280, third insulating layer 290, and overcoat 295 need not cover any portion of the second auxiliary gate pad 275 and second auxiliary data pad 277. See, e.g., FIG. 2. As a result, the second auxiliary gate pad 275 and second auxiliary data pad 277 may be exposed, and can contact with an external terminal.

In some embodiments (not illustrated), a polarizer may be formed on upper and lower surfaces of the display device. The polarizer may include a first polarizer and a second polarizer. The first polarizer may be formed on a lower surface of the substrate, and the second polarizer may be formed on the overcoat 295.

Next, an exemplary method of manufacturing the display device of FIGS. 1 to 3 will be described below with reference to FIGS. 4 to 23.

FIGS. 4 to 23 are cross-sectional views of the display device at different stages of fabrication. Specifically, FIGS. 4, 6, 8, 10, 12, 14, 16, 18, 20, and 22 are cross-sectional views taken along a same location on line II-II of FIG. 1. FIGS. 5, 7, 9, 11, 13, 15, 17, 19, 21, and 23 are cross-sectional views taken along another same location on line III-III of FIG. 1.

Figure 4:
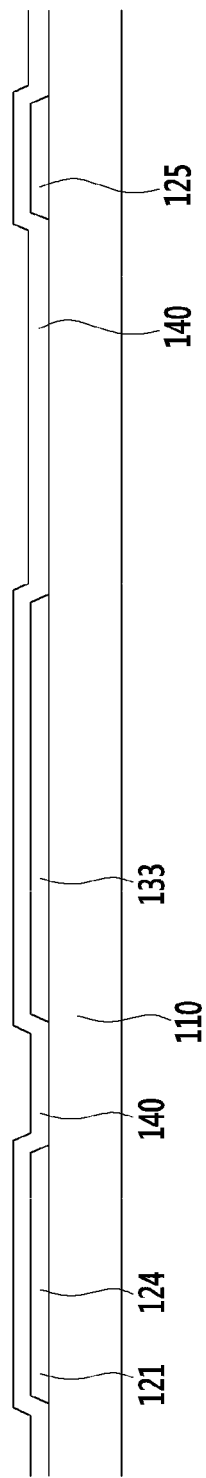
FIGS. 4 to 23 are cross-sectional views illustrating an exemplary method of manufacturing the display device of FIGS. 1 to 3.

First, as shown in FIG. 4, a gate line 121 and a gate electrode 124 are formed on a substrate 110. The gate line 121 is formed extending in a particular direction (e.g., horizontal direction) on the substrate 110. The gate electrode 124 is formed protruding from the gate line 121. The substrate 110 may be formed of glass, plastic, or other appropriate substrate materials.

As previously described with reference to FIG. 1, a gate pad 125 is formed connected to the gate line 121. The gate pad 125 is formed connected to an end of the gate line 121. A width of the gate pad 125 may be greater than a width of the gate line 121. See, e.g., FIG. 1. The gate pad 125 may be formed of the same material as the gate line 121 and gate electrode 124. The gate pad 125, gate line 121, and gate electrode 124 may be formed in the same process step.

Figure 5:
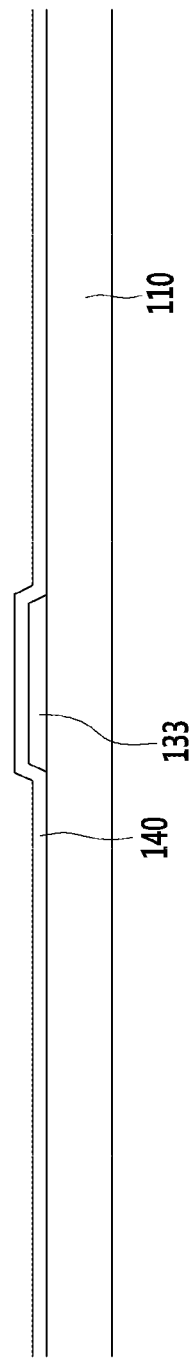

Referring to FIGS. 4 and 5, a storage electrode 133 is formed being spaced apart from the gate line 121 and gate electrode 124. The storage electrode 133 may be formed of the same material as the gate line 121 and gate electrode 124. The storage electrode 133, gate line 121, and gate electrode 124 may be formed in the same process step.

Referring to FIGS. 4 and 5, a gate insulating layer 140 is formed over the surface of the substrate 110 (on the gate line 121, gate electrode 124, gate pad 125, and storage electrode 133). The gate insulating layer 140 may be formed of an inorganic insulating material (such as silicon oxide (SiOx) or silicon nitride (SiNx)). In some embodiments, the gate insulating layer 140 may be formed as a single layer. In some other embodiments, the gate insulating layer 140 may be formed as a multilayer.

Figure 6:
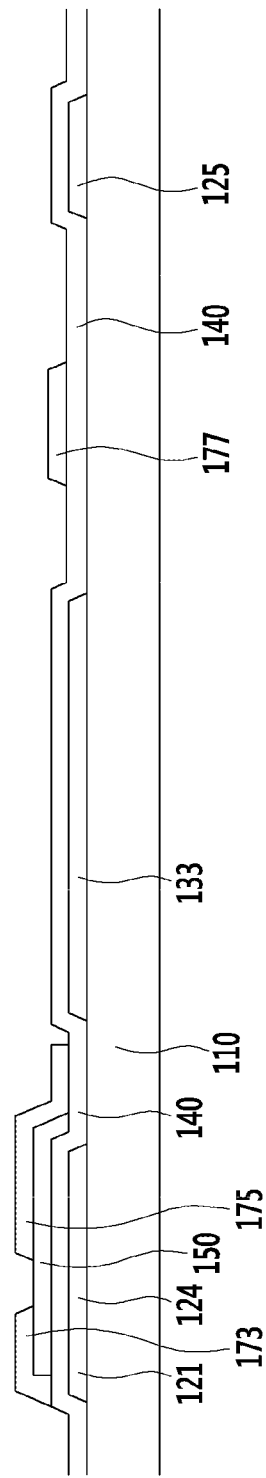

Referring to FIG. 6, a semiconductor material (such as amorphous silicon, polycrystalline silicon, or metal oxide) is deposited on the gate insulating layer 140, and patterned to form a semiconductor layer 150. The semiconductor layer 150 may be formed on the gate electrode 124.

Figure 7:
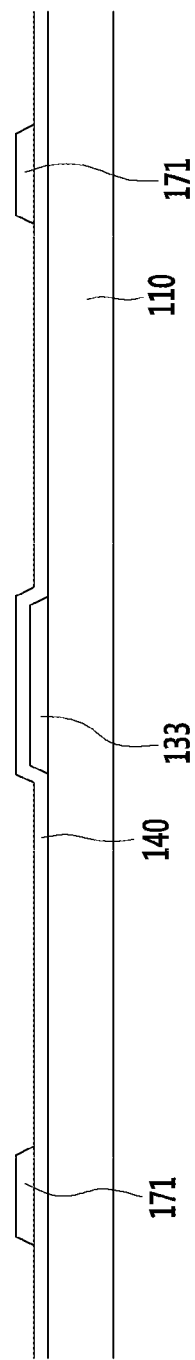

Referring to FIG. 7, a data line 171 is formed extending in another direction (e.g., vertical direction) on the substrate 110. The data line 171 is formed by depositing a metal material over the structure of FIG. 5 and patterning the metal material. In some embodiments, the metal material may be deposited as a single layer. In some other embodiments, the metal material may be deposited as a multilayer.

Referring back to FIG. 6, a source electrode 173 and a drain electrode 175 are formed on the semiconductor layer 150. The source electrode 173 is formed protruding from the data line 171, and the drain electrode 175 is formed being spaced apart from the source electrode 173.

With reference to FIG. 6, a data pad 177 is formed connected to the data line 171. For example, the data pad 177 is formed connected to an end of the data line 171. A width of the data pad 177 may be greater than a width of the data line 171. The data pad 177 may be formed of the same material as the data line 171, source electrode 173, and drain electrode 175. The data pad 177, data line 171, source electrode 173, and drain electrode 175 may be formed in the same process step.

For example, the semiconductor material and metal material may be sequentially deposited, and patterned in the same process step to form the semiconductor layer 150, data line 171, source electrode 173, drain electrode 175, and data pad 177. The semiconductor layer 150 may be formed extending to a lower portion of the data line 171 and data pad 177.

The gate electrode 124, semiconductor layer 150, source electrode 173, and drain electrode 175 collectively constitute a thin film transistor. The gate line 121 and data line 171 may be formed crossing each other (i.e., perpendicular to each other). A plurality of pixel regions may be defined by the gate lines 121 crossing the data lines 171.

Figure 8:
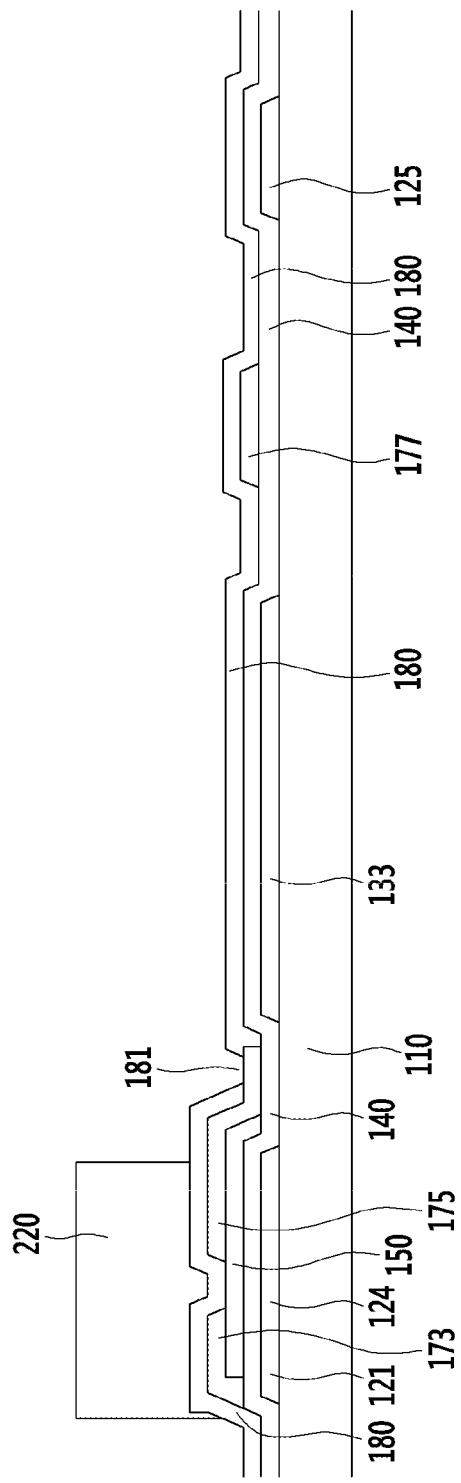
Figure 9:
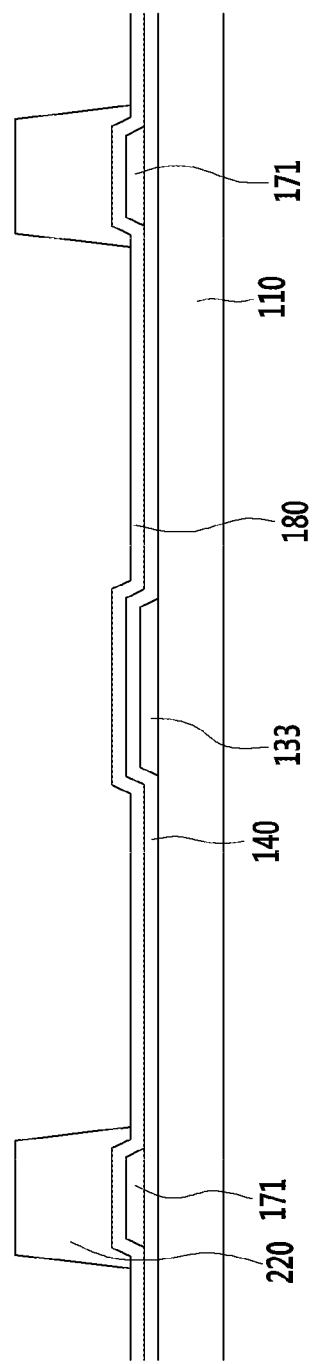

Referring to FIGS. 8 and 9, a passivation layer 180 is formed on the data line 171, source electrode 173, drain electrode 175, and the exposed portion of the semiconductor layer 150 between the source electrode 173 and drain electrode 175. In some embodiments, the passivation layer 180 may be formed of an organic insulating material. In other embodiments, the passivation layer 180 may be formed of an inorganic insulating material. Also, in some embodiments, the passivation layer 180 may be formed as a single layer. In some other embodiments, the passivation layer 180 may be formed as a multilayer.

Next, a light blocking material is deposited on the passivation layer 180 and patterned to form a light blocking member 220 at a boundary of the pixel regions. The light blocking member 220 may be formed as a partition wall surrounding the pixel regions. The light blocking member 220 may be formed on the thin film transistor.

In some embodiments, the light blocking member 220 may be formed on a portion of the thin film transistor without partially overlapping with the drain electrode 175. However, the present inventive concept is not limited to the above-described configuration. For example, in some other embodiments, the light blocking member 220 may be formed covering the thin film transistor.

Referring to FIG. 8, a first contact hole 181 is formed by etching the passivation layer 180 to expose at least a portion of the drain electrode 175.

As mentioned above, in some embodiments, the light blocking member 220 is formed without partially overlapping with the drain electrode 175. In those embodiments, the first contact hole 181 may be formed only in the passivation layer 180. Nevertheless, in some other embodiments, the light blocking member 220 may be formed completely overlapping with the drain electrode 175. In those other embodiments, the first contact hole 181 may be formed in the light blocking member 220 and passivation layer 180.

When forming the first contact hole 181, a second contact hole 185 may also be formed, by etching the gate insulating layer 140 and passivation layer 180 to expose at least a portion of the gate pad 125. Additionally, a third contact hole 187 may be formed by etching the passivation layer 180 to expose at least a portion of the data pad 177. See, e.g., FIG. 10.

Figure 10:
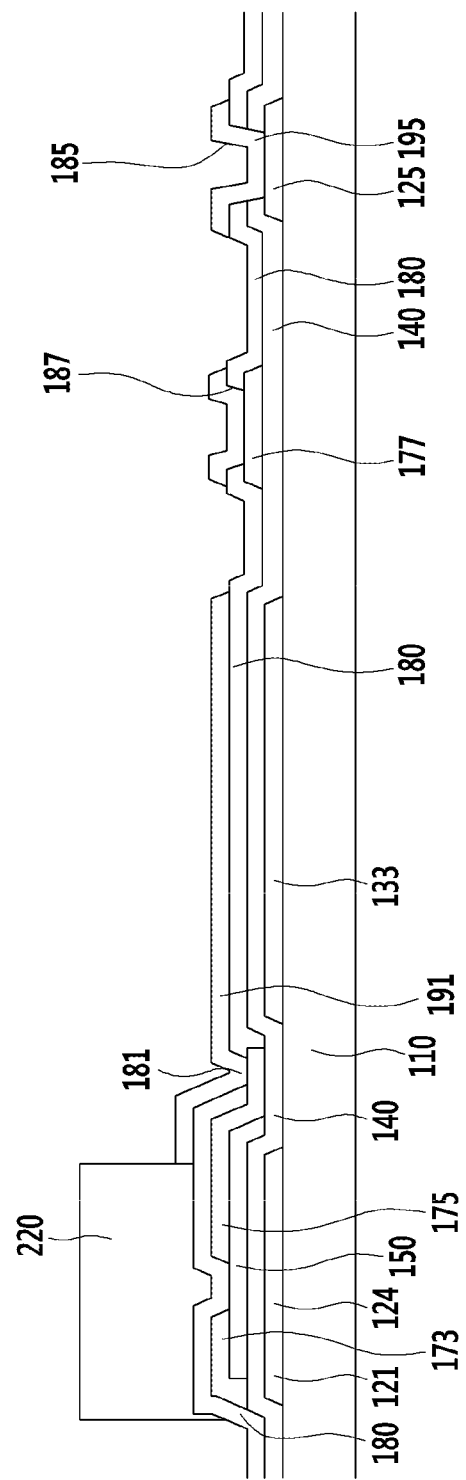
Figure 11:
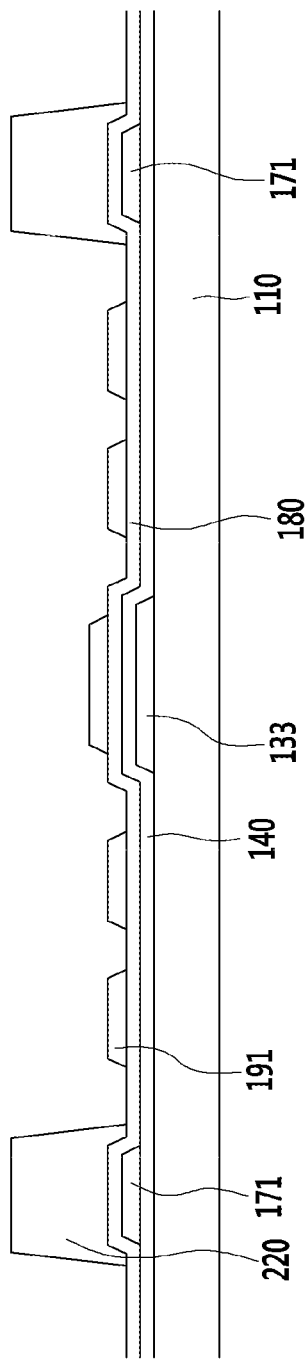

Referring to FIGS. 10 and 11, a transparent metal material (such as indium-tin oxide (ITO) or indium-zinc oxide (IZO)) is deposited on the light blocking member 220 and passivation layer 180, and patterned to form a pixel electrode 191 in the pixel region. The pixel electrode 191 is formed connected to the drain electrode 175 through the first contact hole 181.

When forming the pixel electrode 191, a first auxiliary gate pad 195 may be formed on the gate pad 125, and a first auxiliary data pad 197 may be formed on the data pad 177. See, e.g. FIG. 10. The first auxiliary gate pad 195 and first auxiliary data pad 197 may be formed of the same material as the pixel electrode 191.

As shown in FIG. 10, a portion of the first auxiliary gate pad 195 may be formed on the passivation layer 180, and another portion of the first auxiliary gate pad 195 may be formed directly on the gate pad 125. Similarly, a portion of the first auxiliary data pad 197 may be formed on the passivation layer 180, and another portion of the first auxiliary data pad 197 may be formed directly on the data pad 177.

Figure 12:
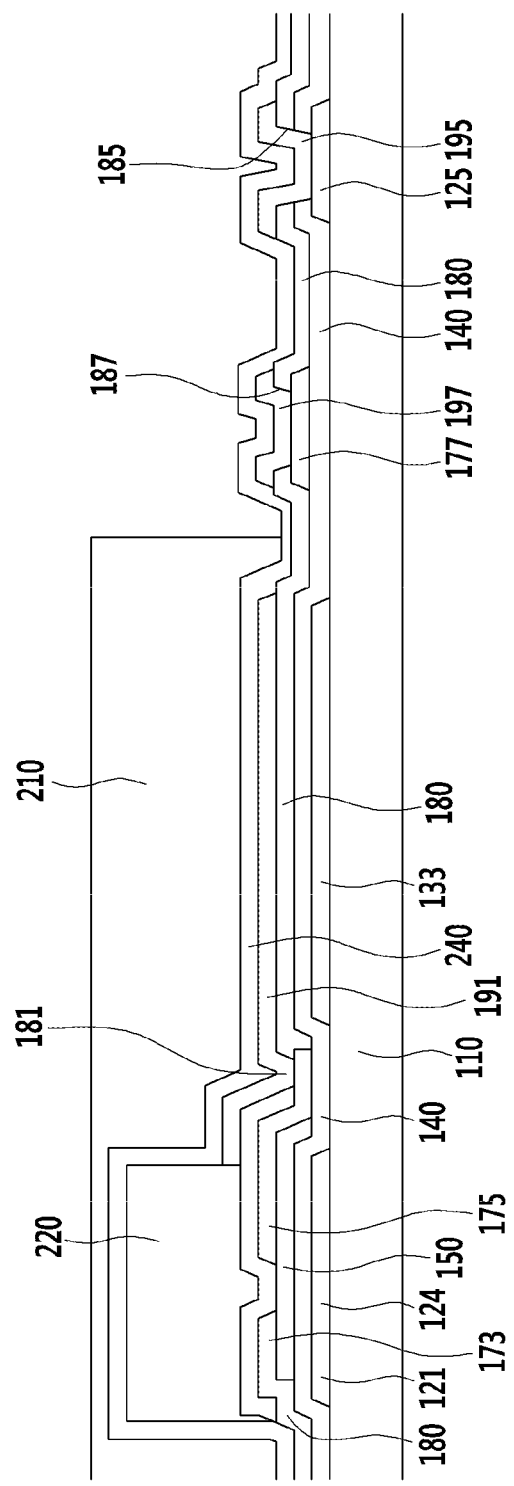
Figure 13:
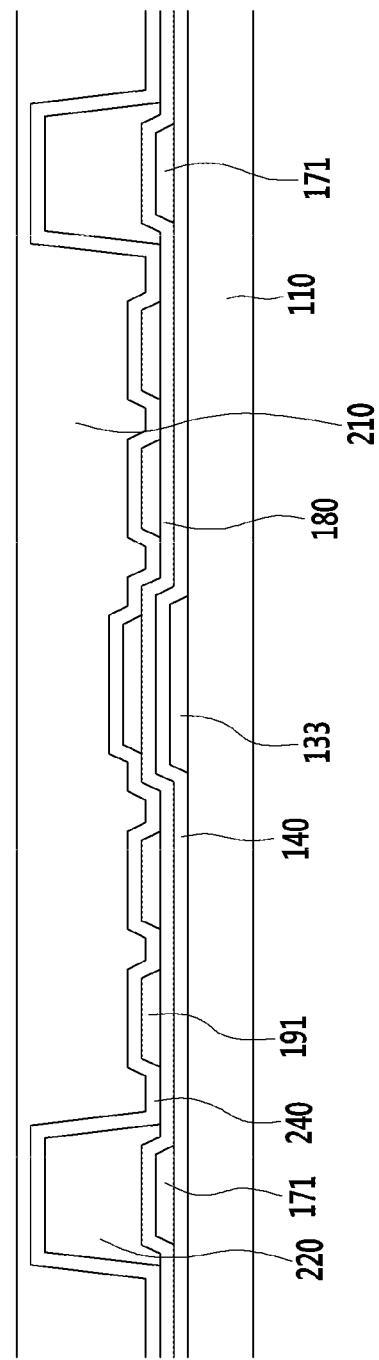

Referring to FIGS. 12 and 13, a first insulating layer 240 is formed on the light blocking member 220 and pixel electrode 191. The first insulating layer 240 may be formed of an inorganic insulating material (such as silicon nitride (SiNx) or silicon oxide (SiOx)).

The first insulating layer 240 may serve several functions. For example, the first insulating layer 240 can act as a protective layer for the light blocking member 220. The first insulating layer 240 can also prevent the pixel electrode 191 (which is formed of conductive metal) from shorting with another metal layer. Nevertheless, in some particular embodiments, the first insulating layer 240 may be omitted.

As further shown in FIGS. 12 and 13, a sacrificial layer 210 is formed on the light blocking member 220 and pixel electrode 191. The sacrificial layer 210 may be formed of an organic insulating material. In some embodiments, the sacrificial layer 210 may be formed on the first insulating layer 240.

In some embodiments, a portion of the sacrificial layer 210 positioned on the first auxiliary gate pad 195 and first auxiliary data pad 197 may be removed by patterning the sacrificial layer 210. See, e.g., FIG. 12.

The sacrificial layer 210 may be formed of a photosensitive polymer material, and a photolithography process may be performed to pattern the sacrificial layer 210.

Figure 14:
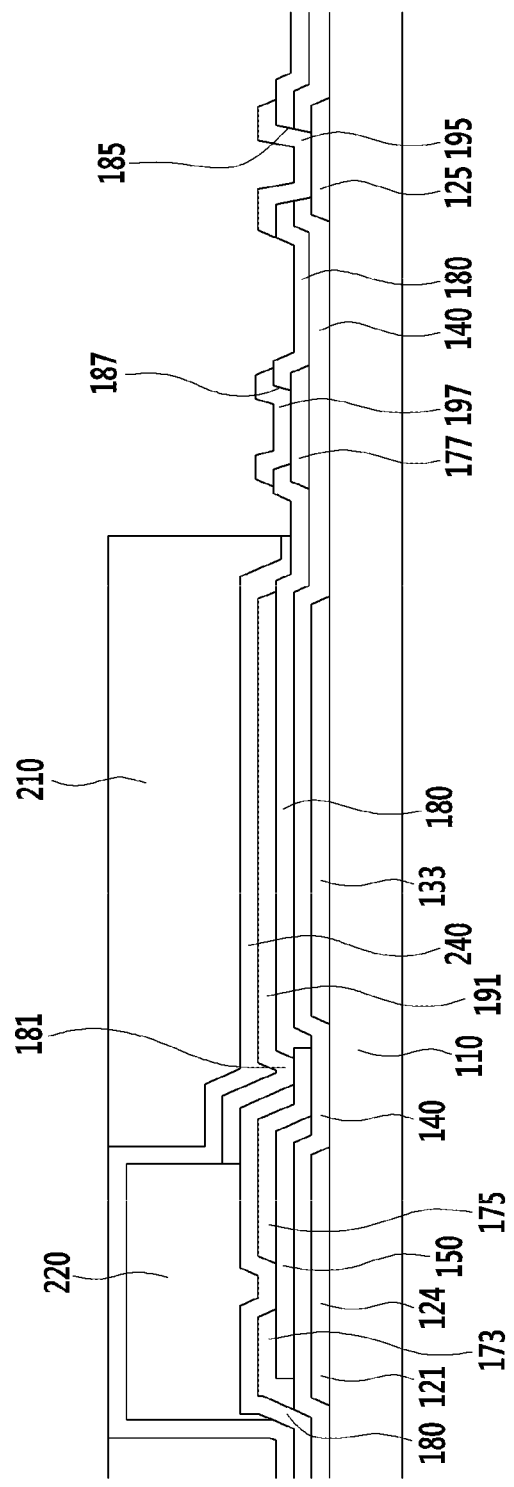

Referring to FIG. 14, a portion of the first insulating layer 240 positioned on the first auxiliary gate pad 195 and first auxiliary data pad 197 is removed by patterning the first insulating layer 240 using the patterned sacrificial layer 210 as a mask.

Figure 15:
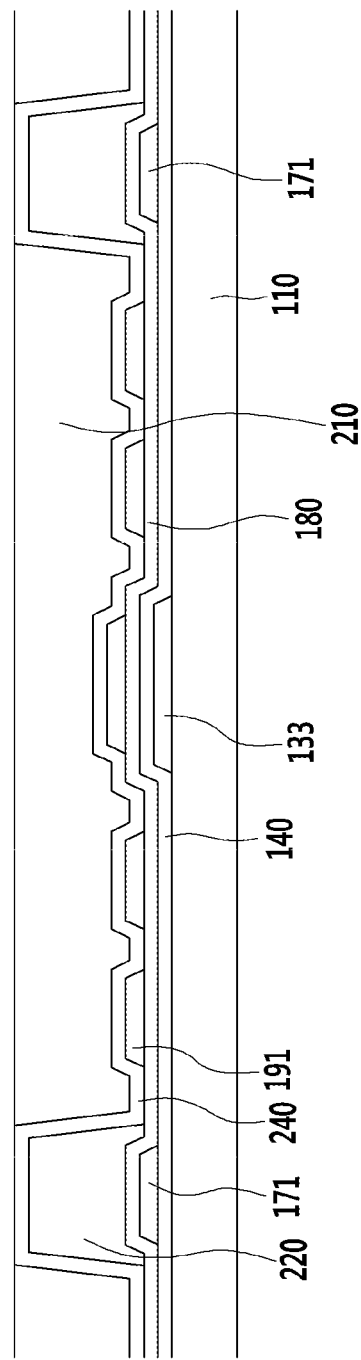

Next, the height of the patterned sacrificial layer 210 is reduced via an ashing process (e.g., using oxygen plasma) to ash the patterned sacrificial layer 210. The ashing process removes a portion of the sacrificial layer 210 that is formed on the light blocking member 220. The ashing process can reduce the height of the sacrificial layer 210 to substantially the same height as the light blocking member 220. See, e.g., FIGS. 14 and 15. As a result, the light blocking member 220 may act as a partition wall surrounding (or separating) the ashed sacrificial layer 210. The ashing process need not completely remove the sacrificial layer 210. As shown in FIGS. 14 and 15, portions of the sacrificial layer 210 remain in the pixel region after the ashing process.

Figure 16:
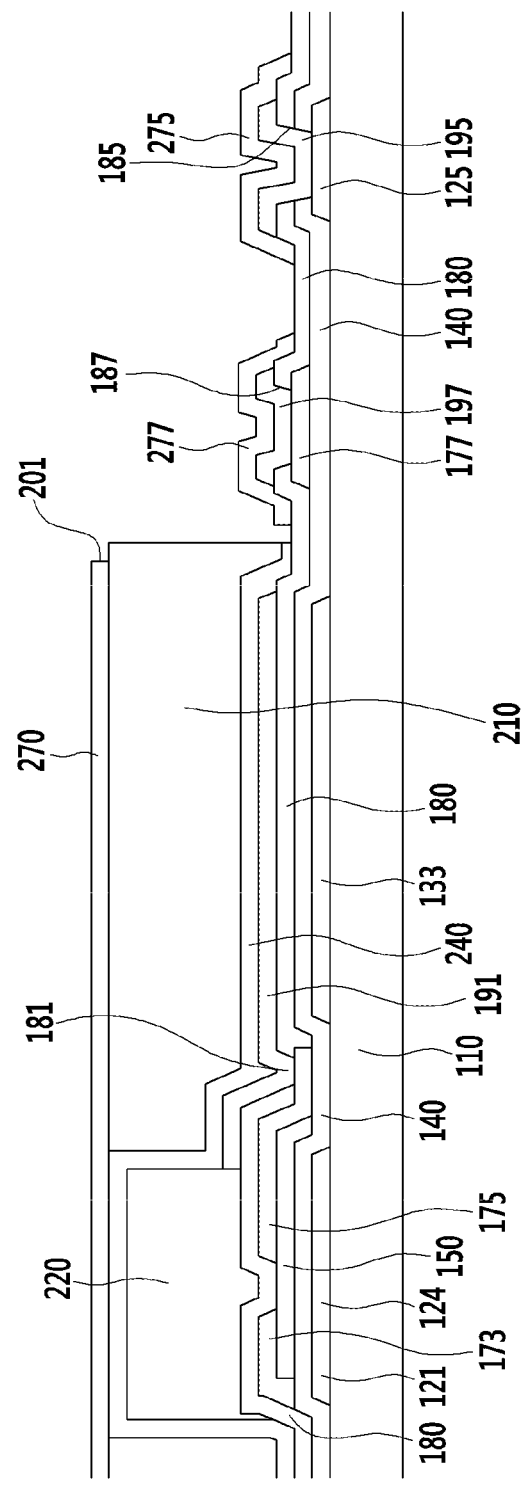
Figure 17:
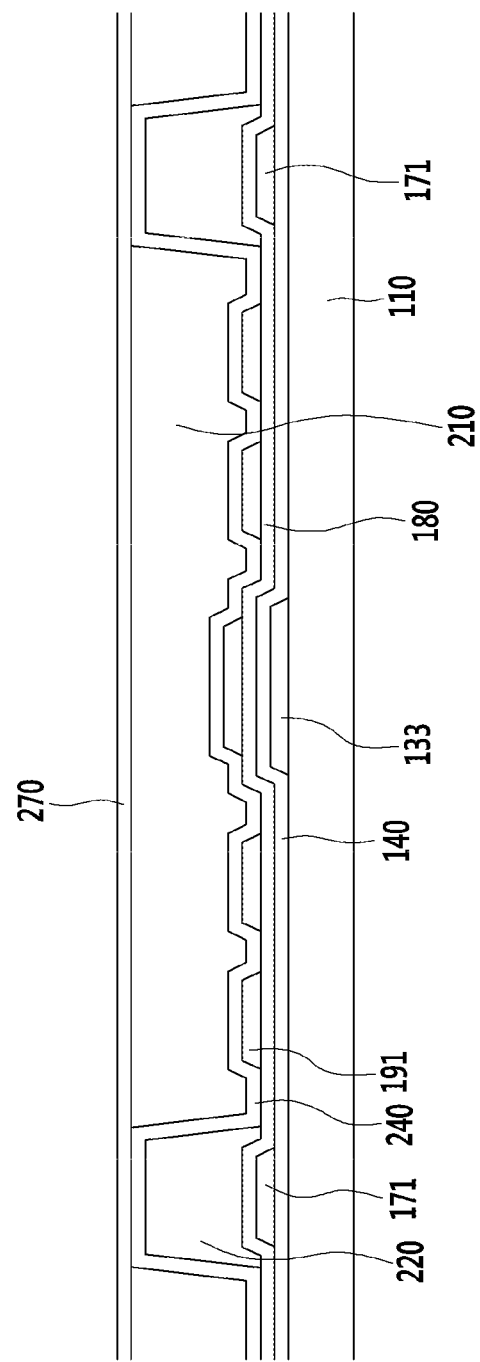

Referring to FIGS. 16 and 17, a transparent metal material is deposited on the sacrificial layer 210 and light blocking member 220, and patterned to form a common electrode 270. The transparent metal material may include indium-tin oxide (ITO) or indium-zinc oxide (IZO). The common electrodes 270 may be formed connected along pixel regions adjacent in a row direction.

Since the common electrode 270 is not formed at a boundary of a portion of the pixel region, a portion of the sacrificial layer 210 may be exposed. For example, since the common electrode 270 is not formed at the boundary of the pixel regions adjacent in a column direction, an opening 201 may be formed exposing a portion of the sacrificial layer 210.

In the above-described embodiments, the common electrodes 270 are formed connected along pixel regions adjacent in a row direction, and the opening 201 is formed at the boundary of pixel regions adjacent in a column direction. However, the present inventive concept is not limited to the above-described configuration. For example, in some other embodiments, the common electrodes 270 may be formed connected along pixel regions adjacent in a column direction, and the opening 201 may be formed at the boundary of pixel regions adjacent in a row direction.

In some embodiments, when forming the common electrode 270, a second auxiliary gate pad 275 may be formed on the first auxiliary gate pad 195 and a second auxiliary data pad 277 may be formed on the first auxiliary data pad 197. See, e.g., FIG. 16. The second auxiliary gate pad 275 and second auxiliary data pad 277 may be formed of the same material as the common electrode 270.

As shown in FIG. 16, the second auxiliary gate pad 275 may be formed covering the first auxiliary gate pad 195. A portion of the second auxiliary gate pad 275 may be formed on the passivation layer 180, and another portion of the second auxiliary gate pad 275 may be formed directly on the first auxiliary gate pad 195.

The second auxiliary data pad 277 may be formed on the first auxiliary data pad 197. The second auxiliary data pad 277 may be formed covering the first auxiliary data pad 197. A portion of the second auxiliary data pad 277 may be formed on the passivation layer 180, and another portion of the second auxiliary data pad 277 may be formed directly on the first auxiliary data pad 197.

In some embodiments, if the first insulating layer 240 formed on the passivation layer 180 is positioned around the first auxiliary gate pad 195 and first auxiliary data pad 197, a portion of the second auxiliary gate pad 275 and a portion of the second auxiliary data pad 277 may be formed on the first insulating layer 240.

In the above-described embodiments, the common electrode 270 is formed after the sacrificial layer 210. However, the present inventive concept is not limited to the above-described order of formation. For example, in some other embodiments, the common electrode 270 may be formed before the sacrificial layer 210. Also, in some embodiments, the pixel electrode 191 and common electrode 270 may be formed of a same layer. In other embodiments, the pixel electrode 191 and common electrode 270 may be formed of different layers with one or more insulating layers interposed therebetween.

Figure 18:
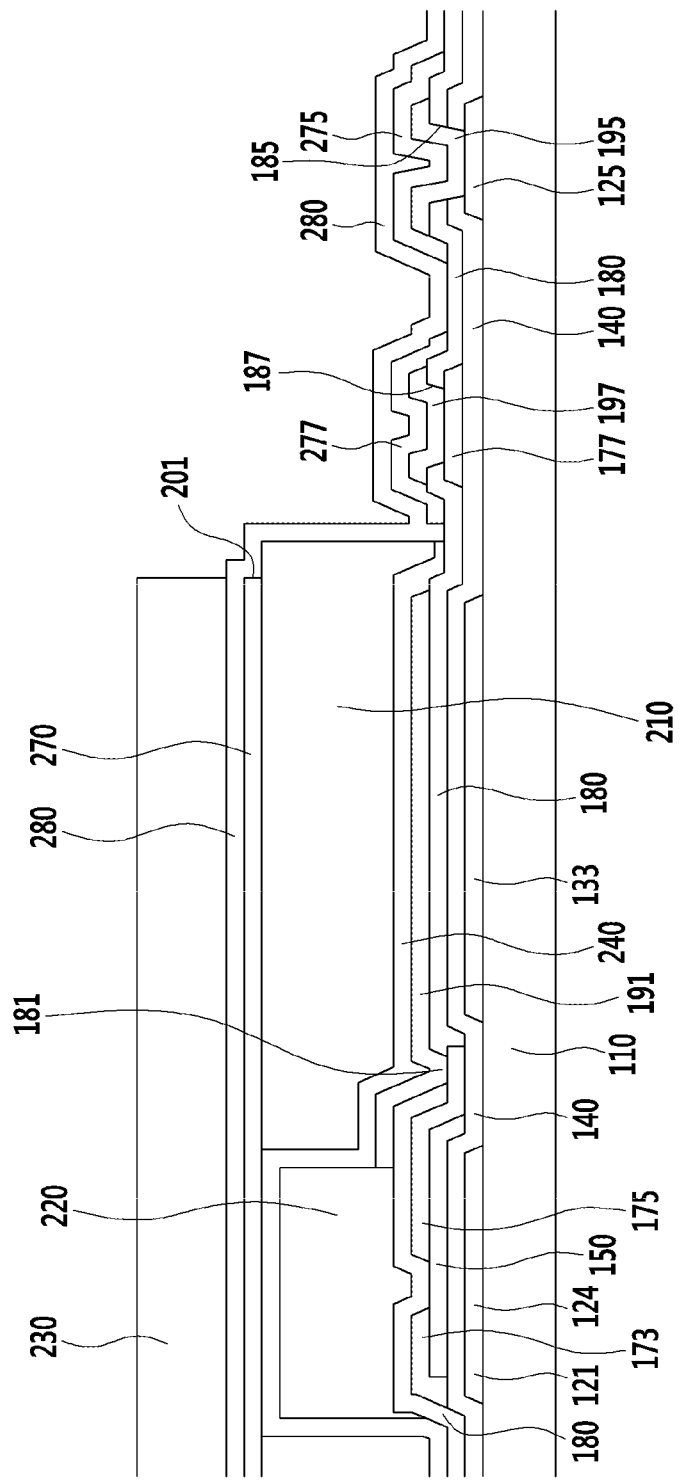
Figure 19:
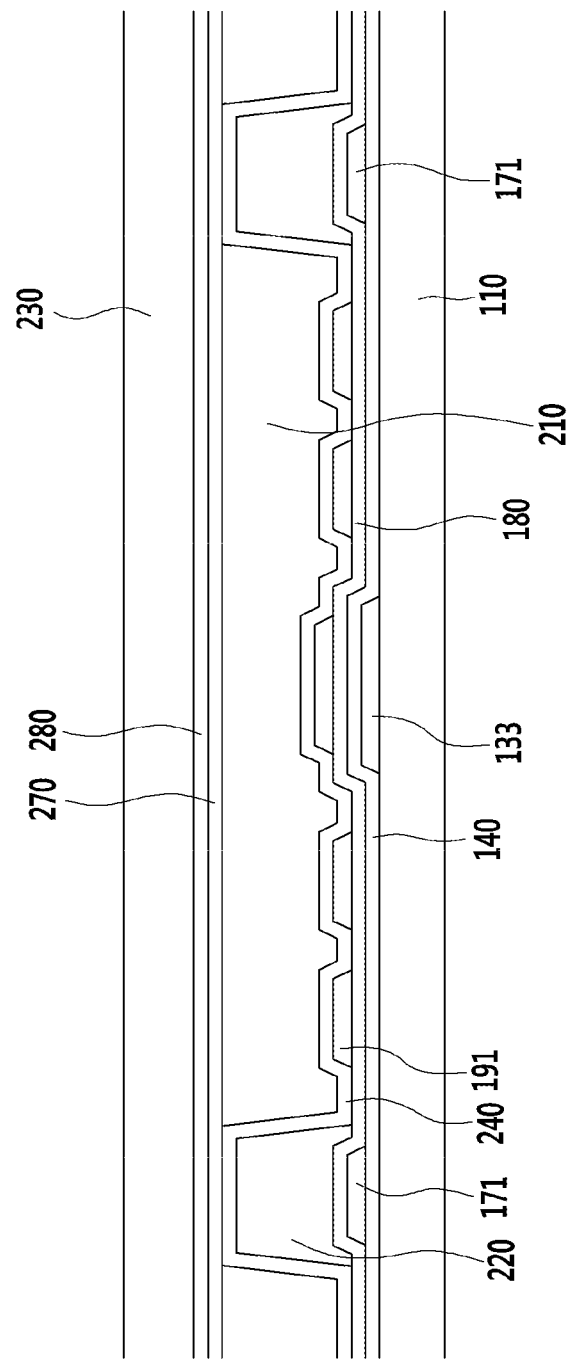

Referring to FIGS. 18 and 19, a second insulating layer 280 is formed on the common electrode 270, second auxiliary gate pad 275, and second auxiliary data pad 277. The second insulating layer 280 may be formed of an inorganic insulating material (such as silicon oxide or silicon nitride). The second insulating layer 280 can act as a protective layer for the common electrode 270, second auxiliary gate pad 275, and second auxiliary data pad 277. In some particular embodiments, the second insulating layer 280 may be omitted.

Next, a roof layer 230 is formed on the common electrode 270. The roof layer 230 may include a color filter. In some embodiments, the roof layer 230 may also be formed on the second insulating layer 280.

The roof layer 230 is formed in each pixel region. The roof layer 230 including color filters having a same color may be formed in a column direction of a plurality of pixel regions. In a roof layer 230 comprising color filters of three different colors, the roof layer 230 may include a first roof layer of a first color, a second roof layer of a second color, and a third roof layer of a third color. The first to third roof layers may be formed as follows. First, after the first roof layer is formed, the second roof layer may be formed by shifting a mask. Next, the third roof layer may be formed by again shifting the mask.

In some particular embodiments, the roof layer 230 need not be formed on the opening 201.

Figure 20:
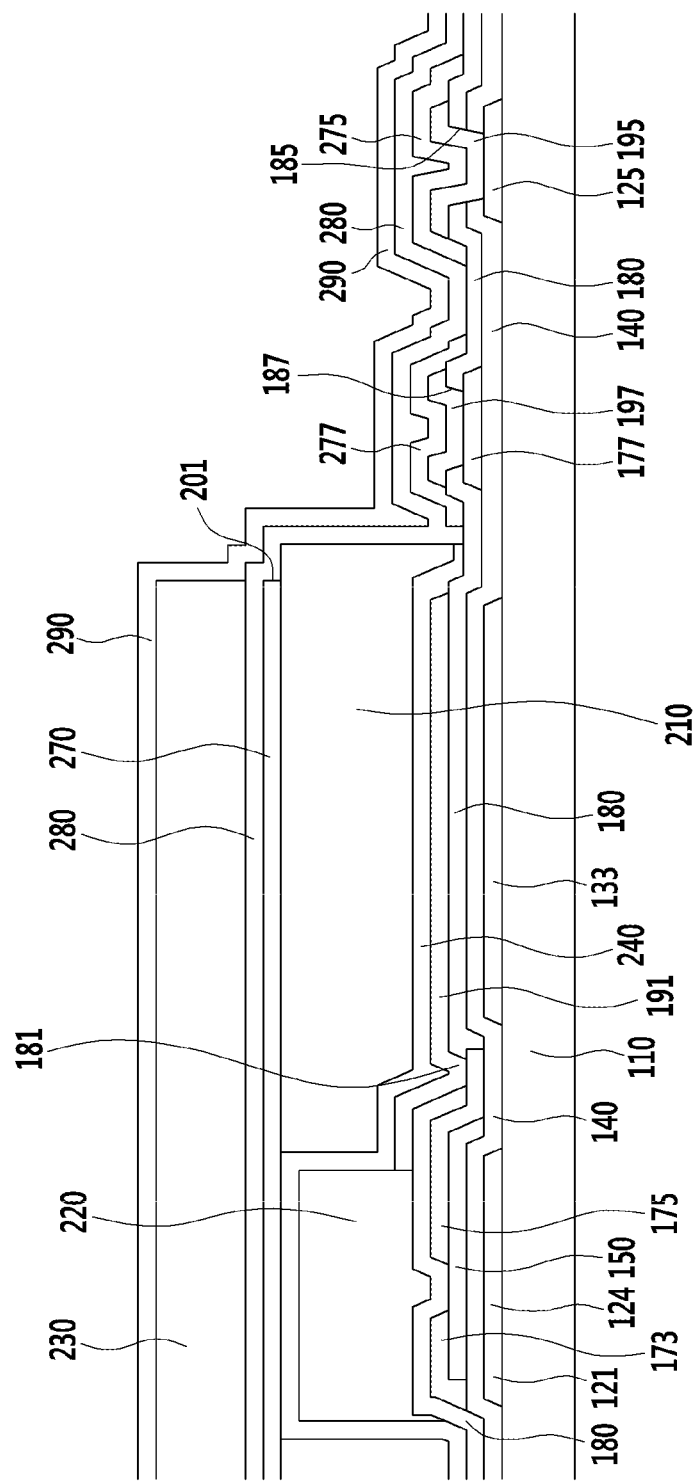
Figure 21:
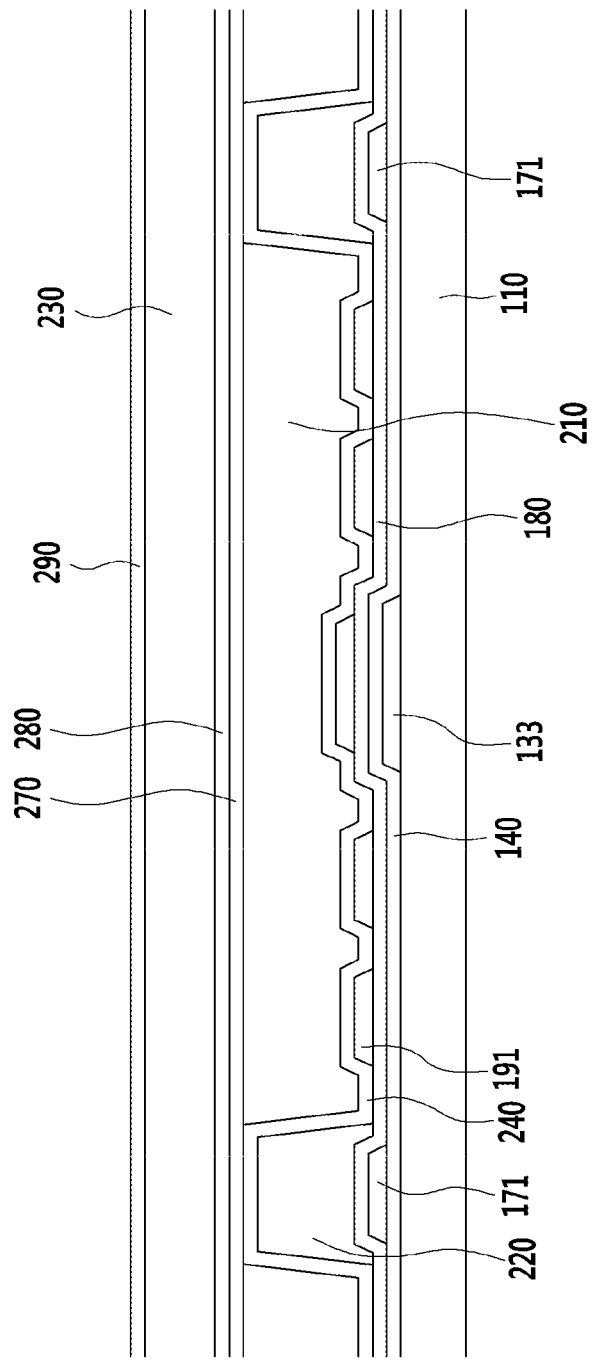

Referring to FIGS. 20 and 21, a third insulating layer 290 may be formed on the roof layer 230 and second insulating layer 280. The third insulating layer 290 may be formed of an inorganic insulating material (such as silicon nitride (SiNx) or silicon oxide (SiOx)). The third insulating layer 290 may be formed on the roof layer 230 to protect an upper surface and a lateral surface of the roof layer 230 by covering the upper surface and lateral surface of the roof layer 230. In some particular embodiments, the third insulating layer 290 may be omitted.

Figure 22:
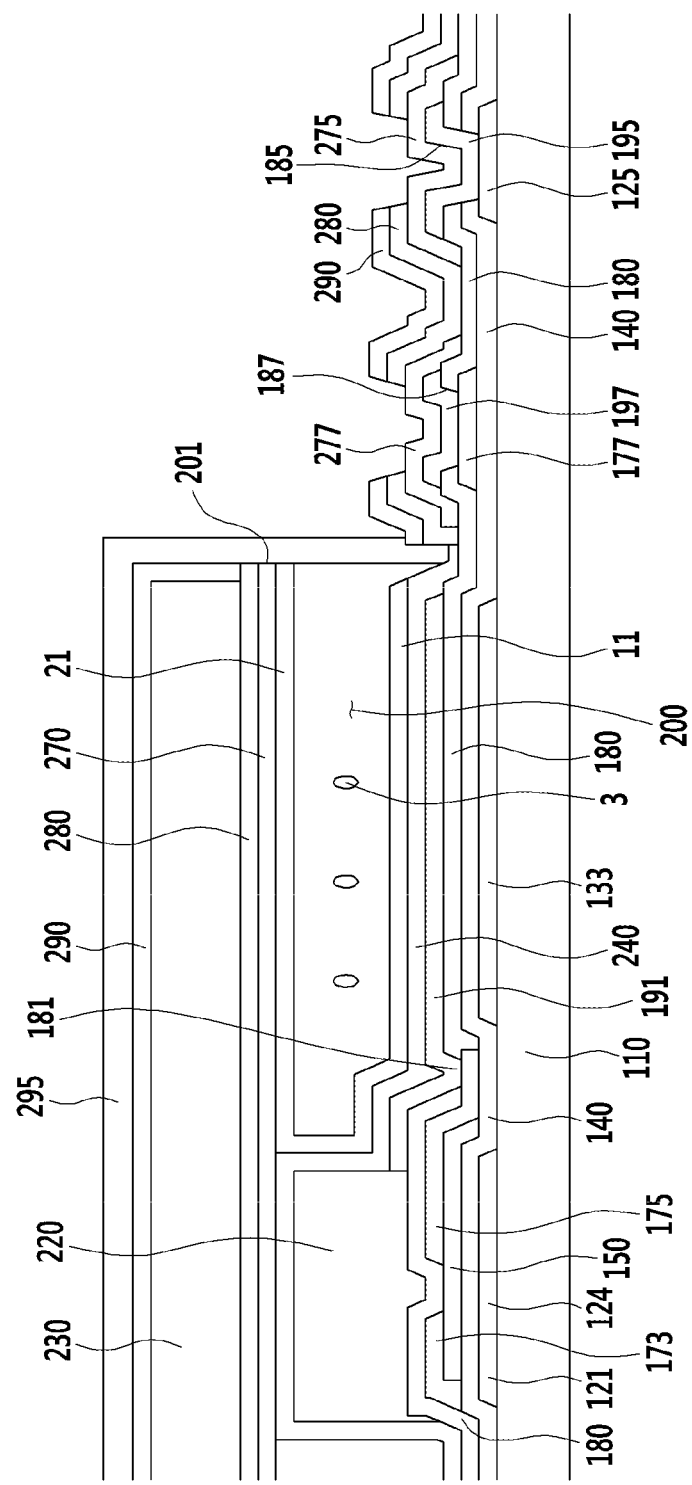
Figure 23:
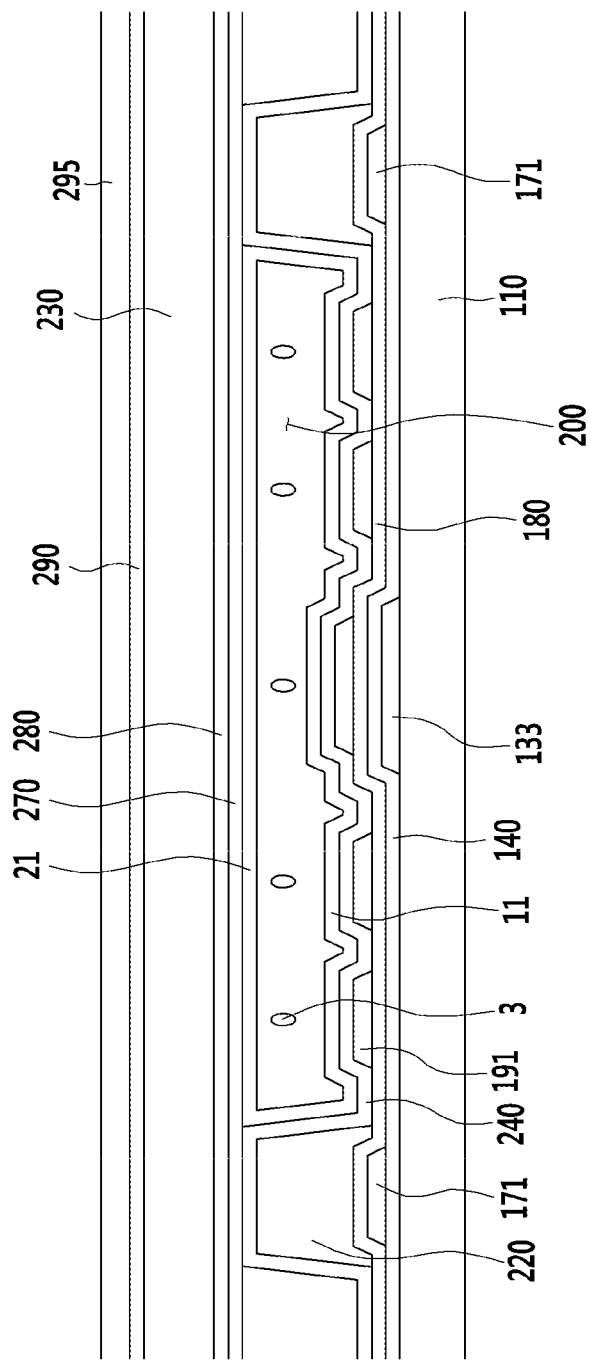

With reference to FIGS. 22 and 23, a portion of the second insulating layer 280 and a portion of the third insulating layer 290 covering the opening 201 are removed by patterning the second insulating layer 280 and third insulating layer 290. The patterning of the second insulating layer 280 and third insulating layer 290 results in a portion of the sacrificial layer 210 being exposed.

As shown in FIG. 22, a portion of the second insulating layer 280 and a portion of the third insulating layer 290 formed on the second auxiliary gate pad 275 and second auxiliary data pad 277 may also be removed.

Next, an ashing process (using for example, oxygen plasma) is performed on the sacrificial layer 210 to remove the sacrificial layer 210. Alternatively, a developing solution may be used to remove the sacrificial layer 210. After the sacrificial layer 210 is removed, a microcavity 200 is formed in a region where the sacrificial layer 210 was previously located. As shown in FIGS. 22 and 23, the pixel electrode 191 and roof layer 230 are spaced apart from each other with the microcavity 200 interposed therebetween. The shape of the microcavity 200 may be maintained by the roof layer 230.

Subsequently, an alignment agent including an alignment material may be dispensed on the substrate 110 using spin coating or an inkjet process, such that the alignment agent is injected through the opening 201 into the microcavity 200. After the alignment agent is injected into the microcavity 200, a curing process may be performed to vaporize a solvent component of the alignment agent. After the curing process, the alignment material remains on an inner wall surface of the microcavity 200.

Referring to FIGS. 22 and 23, a first alignment layer 11 may be formed on the pixel electrode 191, and a second alignment layer 21 may be formed under the common electrode 270. In some embodiments, the first alignment layer 11 may be formed on the first insulating layer 240.

The first alignment layer 11 and second alignment layer 21 are formed facing each other with the microcavity 200 interposed therebetween, and are formed connected to each other at the edge of the pixel regions. Thus, the first alignment layer 11 and second alignment layer 21 may also be formed on a lateral surface of the light blocking member 220 that is in contact with the microcavity 200.

The first alignment layer 11 and second alignment layer 21 are generally aligned in a direction that is parallel to the surface of the first substrate 110, except at the lateral surface of the microcavity 200 where the first and second alignment layers 11 and 21 are aligned perpendicular to the surface of the first substrate 110.

In another embodiments, the first and second alignment layers 11 and 21 can be aligned in a direction that is parallel to the substrate 110, by additionally performing a UV irradiation process on the first and second alignment layers 11 and 21.

Next, a liquid crystal 3 including liquid crystal molecules can be dispensed on the substrate 110 using an inkjet method, such that the liquid crystal 3 is injected through the opening 201 into the microcavity 200. The liquid crystal 3 may be selectively dispensed. For example, in some embodiments, the liquid crystal 3 is dispensed on an opening 201 formed adjacent to an odd numbered gate line, and is not dispensed on an opening 201 formed adjacent to an even numbered gate line. In some other embodiments, the liquid crystal 3 is dispensed on an opening 201 formed adjacent to the even numbered gate line, and is not dispensed on an opening 201 formed adjacent to the odd numbered gate line.

When the liquid crystal 3 is dispensed on the opening 201 formed adjacent to the odd numbered gate line, the liquid crystal 3 flows through the opening 201 into the microcavity 200 due to capillary force. When the liquid crystal 3 flows through the microcavity 200, air is discharged from the microcavity 200 through the opening 201 formed along the even numbered gate line. The discharge of air from the microcavity 200 allows the liquid crystal 3 to be continuously injected into the microcavity 200 through the opening 201 (positioned on and under the odd numbered gate line).

Next, an overcoat 295 is formed by depositing a material (that does not react with the liquid crystal 3) on the third insulating layer 290. For example, the overcoat 295 may be formed of a material such as parylene. The overcoat 295 is formed covering the opening 201 through which the microcavity 200 is exposed, thereby sealing the microcavity 200 for each pixel region.

The overcoat 295 may be formed as a multilayer (such as a double layer or a triple layer). In some embodiments, the overcoat 295 may include a layer formed of an organic insulating material and a layer formed of an inorganic insulating material.

In some embodiments, the overcoat 295 need not cover any portion of the second auxiliary gate pad 275 and second auxiliary data pad 277. As a result, the second auxiliary gate pad 275 and second auxiliary data pad 277 are exposed, and can contact with an external terminal.

Also, in some embodiments, a polarizer (not illustrated) may be formed on the upper and lower surfaces of the display device. The polarizer may include a first polarizer and a second polarizer. The first polarizer may be formed on a lower surface of the substrate 110 and the second polarizer may be formed on the overcoat 295.

As previously mentioned, in a conventional liquid crystal display device, the two display panels are typically formed on different substrates. For example, a first substrate is used for the thin film transistor array panel, and a second substrate is used for the counter display panel. In contrast, the exemplary display device according to this inventive concept does not require a different substrate for each of the two display panels. As shown in FIGS. 1 to 23, the elements of the liquid crystal display device (on the display panels) can be fabricated on a single substrate. As a result, the weight and form factor of the exemplary display device can be significantly reduced compared to a conventional display device. Also, the exemplary display device and method of manufacturing the device can lower fabrication costs and turn-around time, since fewer masks (and only one substrate) are used.

Next, a display device according to another exemplary embodiment of the present inventive concept will be described below with reference to FIGS. 24 and 25. Specifically, FIGS. 24 and 25 are cross-sectional views of the display device taken along different cross-sectional lines.

Figure 24:
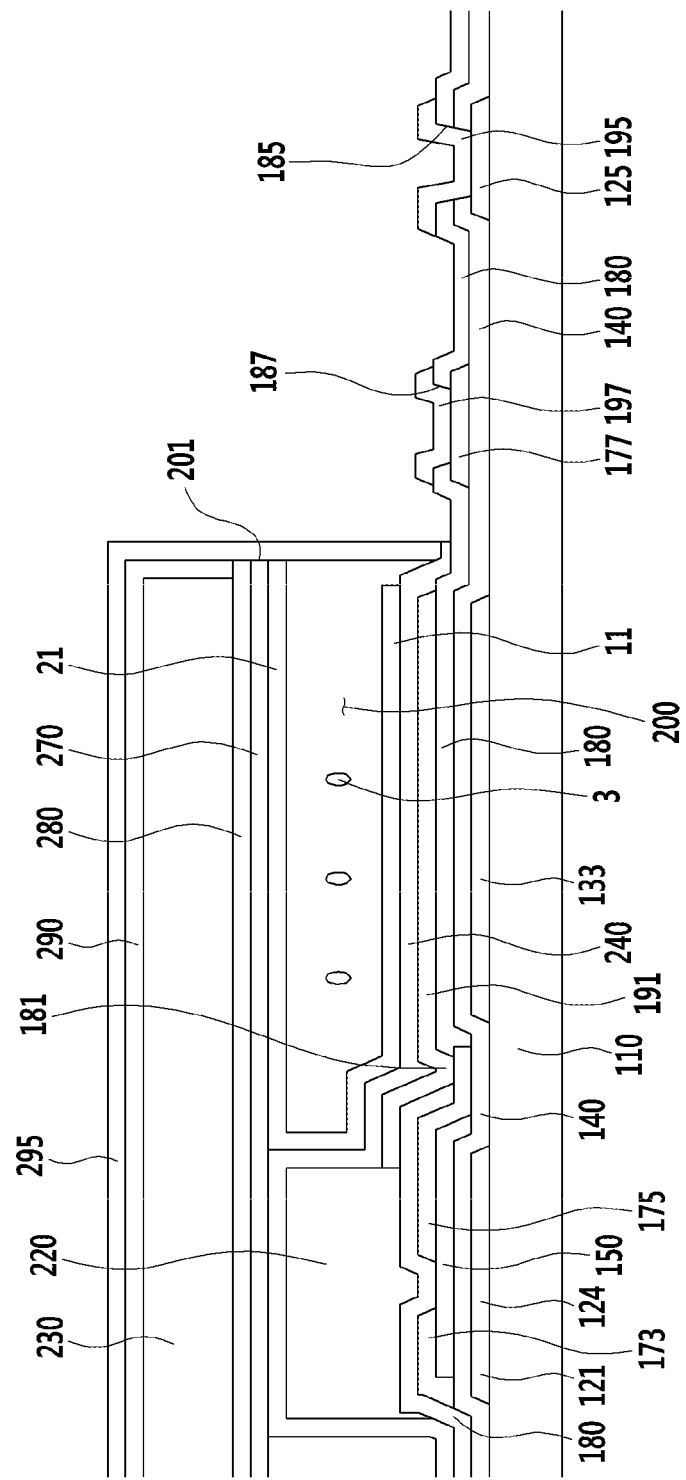
FIGS. 24 and 25 are cross-sectional views illustrating the display device according to another exemplary embodiment of the present inventive concept.
Figure 25:
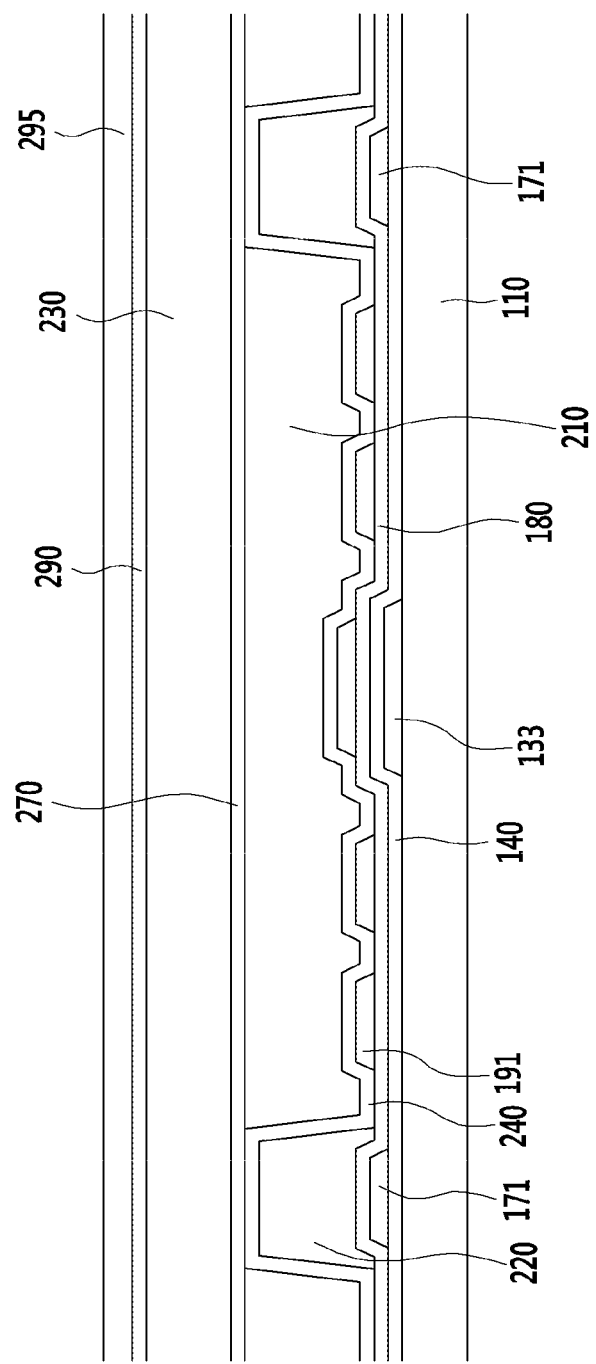

The display device of FIGS. 24 and 25 share many similar features with the display device of FIGS. 1 to 3. Therefore reference to some of the similar features shall be omitted.

Referring to FIG. 24, a gate line 121, a data line 171, and a thin film transistor are formed on a substrate 110. A plurality of pixel regions are defined by a plurality of gate lines 121 crossing the data lines 171. A light blocking member 220 is formed at a boundary of the pixel regions, and a pixel electrode 191 is formed in the pixel region. A common electrode 270 is formed being spaced apart from the pixel electrode 191 with a microcavity 200 interposed therebetween. A roof layer 230 including a color filter is formed on the common electrode 270. An opening 201 is formed in the common electrode 270 and roof layer 230. A liquid crystal 3 is injected into the microcavity 200 through the opening 201. An overcoat 295 is formed on the roof layer 230 to cover the opening 201, thereby sealing the microcavity 200 for each pixel region.

The differences between the display device of FIGS. 24 and 25 and the display device of FIGS. 1 to 3 will be described below. The display device of FIGS. 24 and 25 and the display device of FIGS. 1 to 3 generally share a similar structure at a boundary of the pixel region, except at the gate pad and data pad portions. For example, the second auxiliary gate pad and second auxiliary data pad need not be formed in the display device of FIGS. 24 and 25.

Referring to FIG. 24, a gate pad 125 is formed connected to a gate line 121. The gate pad 125 may be formed of the same material as the gate line 121 and gate electrode 124.

A data pad 177 is formed connected to a data line 171. The data pad 177 may be formed of the same material as the data line 171, source electrode 173, and drain electrode 175.

A first auxiliary gate pad 195 is formed on the gate pad 125, and a first auxiliary data pad 197 is formed on the data pad 177. The first auxiliary gate pad 195 and first auxiliary data pad 197 may be formed of the same material as the pixel electrode 191.

Unlike the display device of FIGS. 1 to 3, the display device of FIGS. 24 and 25 does not have a layer (that is formed of the same material as the common electrode 270) formed on the first auxiliary gate pad 195 and first auxiliary data pad 197.

A second insulating layer 280, a third insulating layer 290, and an overcoat 295 may be formed on a common electrode 270. However, in some embodiments, the second insulating layer 280, third insulating layer 290, and overcoat 295 need not be formed on the first auxiliary gate pad 195 and first auxiliary data pad 197. As a result, the first auxiliary gate pad 195 and first auxiliary data pad 197 may be exposed, and can contact with an external terminal.

Next, referring to FIGS. 26 to 31, an exemplary method of manufacturing the display device of FIGS. 24 and 25 will be described below.

Figure 26:
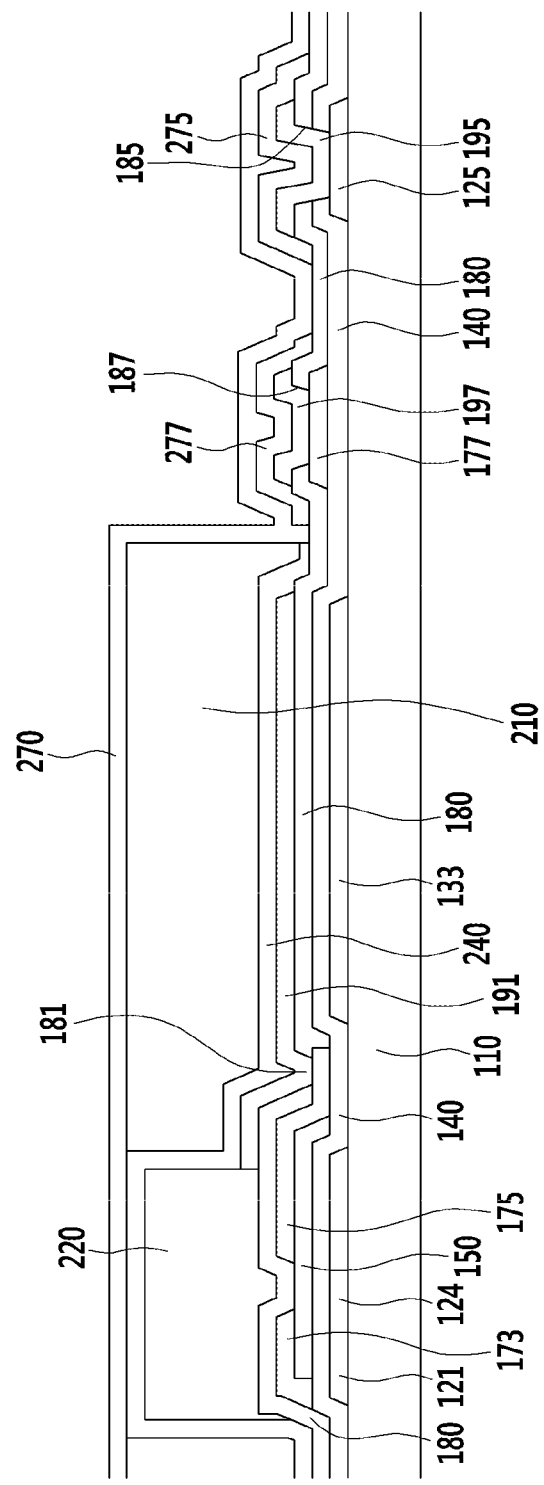
FIGS. 26 to 31 are cross-sectional views illustrating an exemplary method of manufacturing the display device of FIGS. 24 and 25.
Figure 27:
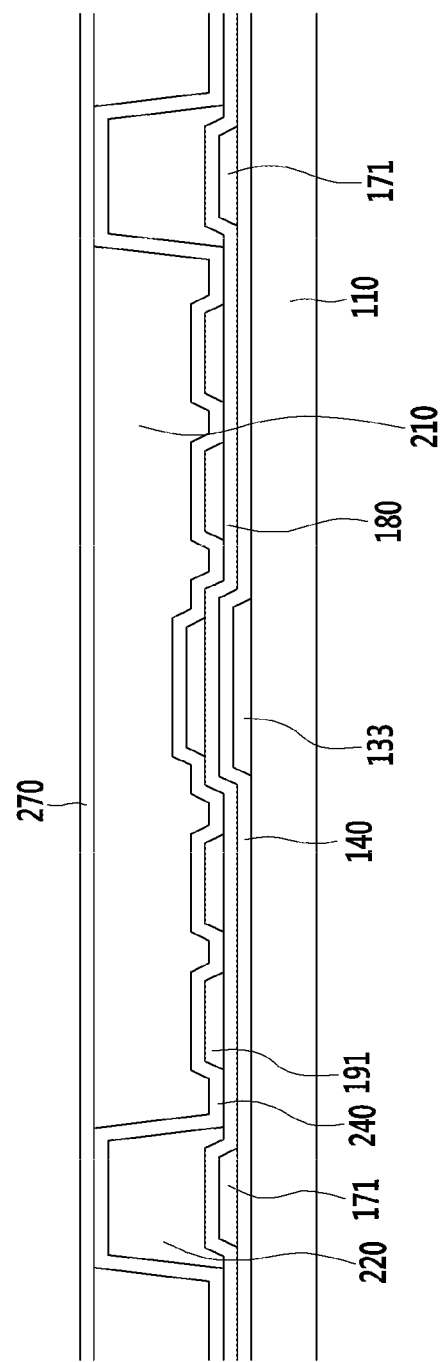
Figure 28:
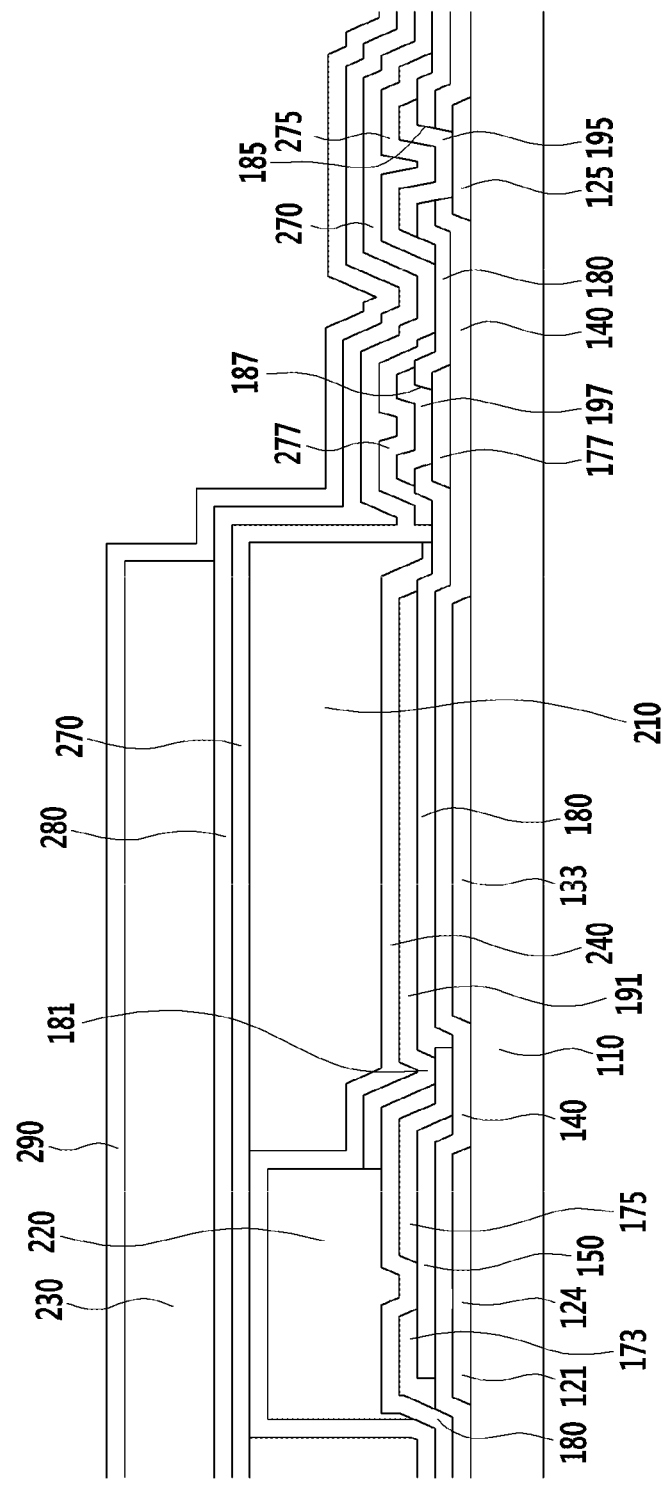
Figure 29:
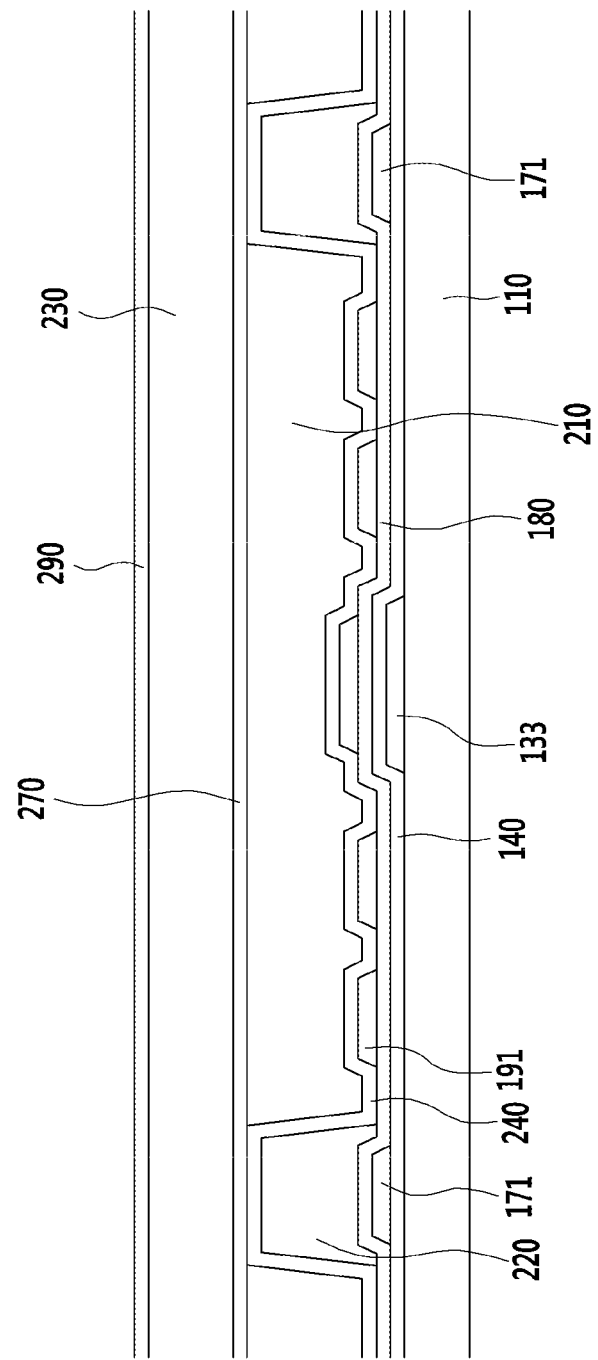
Figure 30:
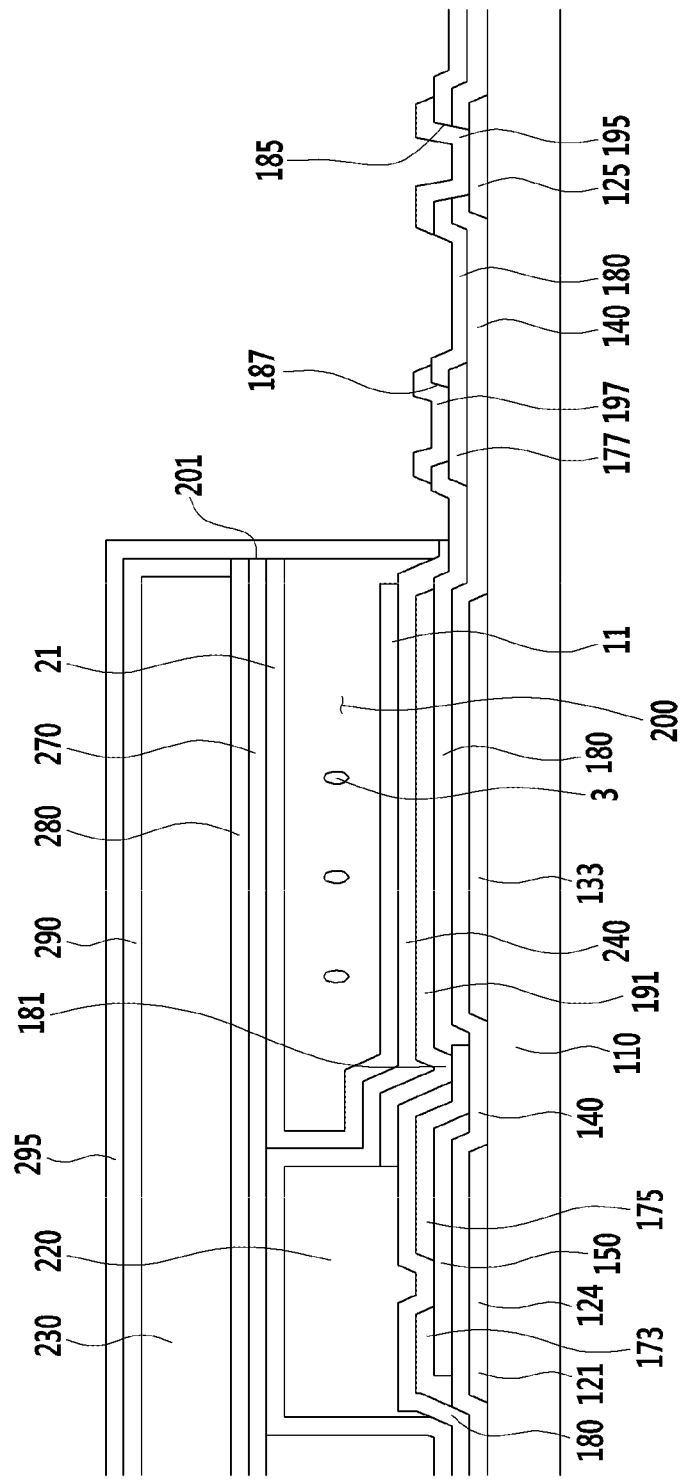
Figure 31:
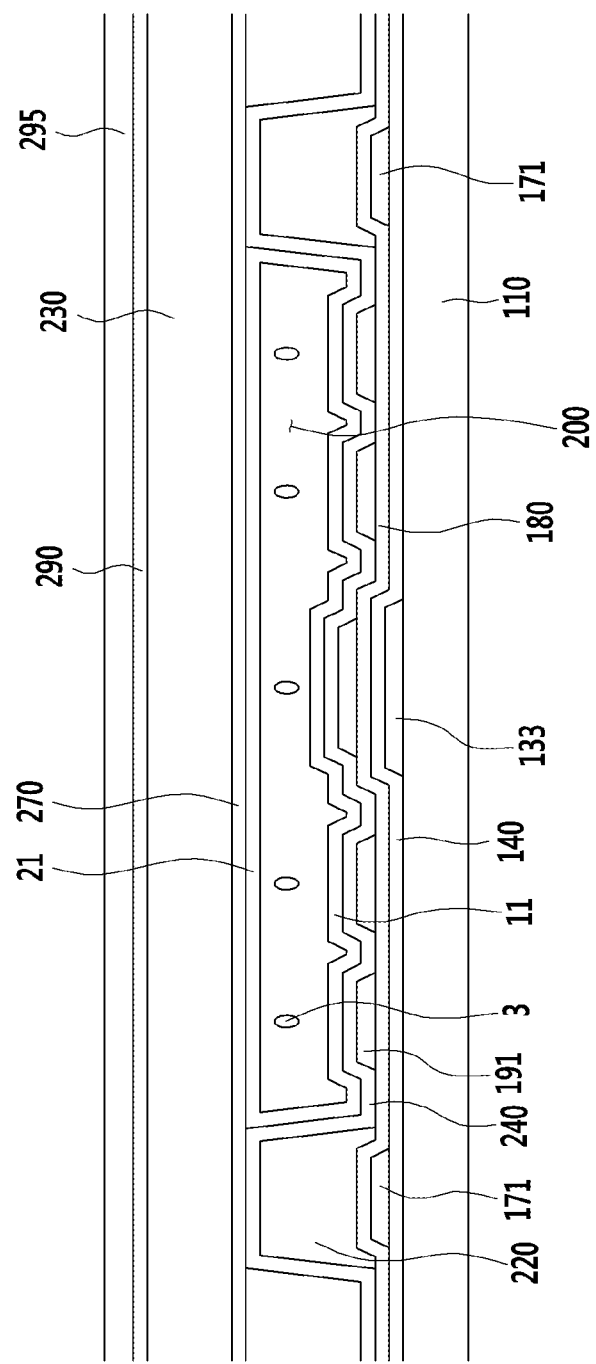

FIGS. 26 to 31 are cross-sectional views of the display device at different stages of fabrication. Specifically, FIGS. 26, 28, and 30 are cross-sectional views taken along a same location on a first cross-sectional line. FIGS. 27, 29, and 31 are cross-sectional views taken along another same location on a second cross-sectional line.

The method described in FIGS. 26 to 31 includes the process steps described in FIGS. 4 to 15, and thus reference to the previously-described process steps shall be omitted. The differences in the methods occur after the step described in FIG. 15, as described below.

As previously mentioned with reference to FIG. 15, an ashing process is performed to remove a portion of the sacrificial layer 210 that is formed on the light blocking member 220.

Referring to FIGS. 26 and 27, a common electrode 270 is formed on a sacrificial layer 210 and a light blocking member 220. The common electrode 270 is formed of a transparent metal material (such as indium-tin oxide (ITO) or indium-zinc oxide (IZO)). The common electrode 270 is also formed on a first auxiliary gate pad 195 and a first auxiliary data pad 197.

As shown in FIGS. 28 and 29, a second insulating layer 280 is formed on the common electrode 270. The second insulating layer 280 is formed of an inorganic insulating material (such as silicon oxide or silicon nitride). The second insulating layer 280 can act as a protective layer for the common electrode 270. In some particular embodiments, the second insulating layer 280 may be omitted.

Next, a roof layer 230 is formed on the common electrode 270. The roof layer 230 may include a color filter. In some embodiments, the roof layer 230 may be formed on the second insulating layer 280.

The roof layer 230 is formed in each pixel region. A roof layer 230 including color filters having a same color may be formed in a column direction of a plurality of pixel regions. In a roof layer 230 comprising color filters of three different colors, the roof layer 230 may include a first roof layer of a first color, a second roof layer of a second color, and a third roof layer of a third color. The first to third roof layers may be formed as follows. First, after the first roof layer is formed, the second roof layer may be formed by shifting a mask. Next, the third roof layer may be formed by again shifting the mask.

Referring to FIGS. 28 and 29, a third insulating layer 290 may be formed on the roof layer 230 and second insulating layer 280. The third insulating layer 290 may be formed of an inorganic insulating material (such as silicon nitride (SiNx) or silicon oxide (SiOx)). The third insulating layer 290 may be formed on the roof layer 230 to protect an upper surface and a lateral surface of the roof layer 230 by covering the upper surface and lateral surface of the roof layer 230. In some particular embodiments, the third insulating layer 290 may be omitted.

With reference to FIGS. 30 and 31, an opening 201 is formed by patterning the common electrode 270, second insulating layer 280, and third insulating layer 290, so as to expose the sacrificial layer 210. The common electrodes 270 may be formed connected along pixel regions adjacent in one direction, and the opening 201 may be formed at the boundary of pixel regions adjacent in another direction.

In some embodiments, the common electrodes 270 may be formed connected along pixel regions adjacent in a row direction, and the opening 201 may be formed at the boundary of pixel regions adjacent in a column direction. In some other embodiments, the common electrodes 270 may be formed connected along pixel regions adjacent in a column direction, and the opening 201 may be formed at the boundary of pixel regions adjacent in a row direction.

The common electrode 270, second insulating layer 280, and third insulating layer 290 formed on the first auxiliary gate pad 195 and first auxiliary data pad 197 may also be removed when the opening 201 is being formed.

Next, an ashing process (using for example, oxygen plasma) is performed on the sacrificial layer 210 to remove the sacrificial layer 210. Alternatively, a developing solution may be used to remove the sacrificial layer 210. After the sacrificial layer 210 is removed, a microcavity 200 is formed in a region where the sacrificial layer 210 was previously located. As shown in FIGS. 30 and 31, the pixel electrode 191 and roof layer 230 are spaced apart from each other with the microcavity 200 interposed therebetween. The shape of the microcavity 200 may be maintained by the roof layer 230.

Next, an alignment agent including an alignment material may be dispensed on the substrate 110 using spin coating or an inkjet process, such that the alignment agent is injected through the opening 201 into the microcavity 200. After the alignment agent is injected into the microcavity 200, a curing process may be performed to vaporize a solvent component of the alignment agent. After the curing process, the alignment material remains on an inner wall surface of the microcavity 200.

As shown in FIGS. 30 and 31, a first alignment layer 11 may be formed on the pixel electrode 191, and a second alignment layer 21 may be formed under the common electrode 270. As previously described in FIGS. 22 and 23, the first alignment layer 11 and second alignment layer 21 may be aligned in directions that are perpendicular or parallel to the surface of the substrate 110.

Next, a liquid crystal 3 including liquid crystal molecules can be dispensed on the substrate 110 using an inkjet method, such that the liquid crystal 3 is injected through the opening 201 into the microcavity 200. The liquid crystal 3 may be selectively dispensed. For example, in some embodiments, the liquid crystal 3 is dispensed on an opening 201 formed adjacent to an odd numbered gate line, and is not dispensed on an opening 201 formed adjacent to an even numbered gate line. In some other embodiments, the liquid crystal 3 is dispensed on an opening 201 formed adjacent to the even numbered gate line, and is not dispensed on an opening 201 formed adjacent to the odd numbered gate line.

Next, an overcoat 295 is formed by depositing a material (that does not react with the liquid crystal 3) on the third insulating layer 290. For example, the overcoat 295 may be formed of a material such as parylene. The overcoat 295 is formed covering the opening 201 through which the microcavity 200 is exposed to the outside, thereby sealing the microcavity 200 for each pixel region.

In some embodiments, the overcoat 295 need not cover any portion of the first auxiliary gate pad 195 and first auxiliary data pad 197. As a result, the first auxiliary gate pad 195 and first auxiliary data pad 197 may be exposed, and can contact with an external terminal.

Also, in some embodiments, a polarizer (not illustrated) may be formed on the upper and lower surfaces of the display device. The polarizer may include a first polarizer and a second polarizer. The first polarizer may be formed on a lower surface of the substrate 110, and the second polarizer may be formed on the overcoat 295.

In the exemplary method described in FIGS. 26 to 31, a separate mask is not needed to pattern the common electrode 270, which simplifies the fabrication process. By patterning the common electrode 270, second insulating layer 280, and third insulating layer 290 using a same mask, further reductions in processing costs and turn-around time can be realized.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the present disclosure.

What is claimed is:

1. A method of manufacturing a display device, comprising:
    forming a thin film transistor on a substrate, the substrate including a pixel region;
    forming a light blocking member at a boundary of the pixel region;
    forming a pixel electrode in the pixel region, the pixel electrode connected to the thin film transistor;
    forming a sacrificial layer on the pixel electrode and the light blocking member;
    ashing the sacrificial layer;
    forming a common electrode on the sacrificial layer and the light blocking member;
    forming a roof layer on the common electrode, the roof layer comprising a color filter;
    forming an opening in the common electrode and the roof layer;
    forming a microcavity by removing the sacrificial layer through the opening;
    injecting a liquid crystal to fill the microcavity through the opening; and
    forming an overcoat to seal the opening.

2. The method of claim 1, further comprising:
    forming a gate line on the substrate;
    forming a gate insulating layer on the gate line;
    forming a data line on the gate insulating layer; and
    forming a passivation layer on the data line,
    wherein a portion of the thin film transistor is connected to the gate line, and another portion of the thin film transistor is connected to the data line.

3. The method of claim 2, further comprising:
    forming a gate pad connected to the gate line;
    forming the gate insulating layer on the gate pad;
    forming a data pad connected to the data line; and
    forming the passivation layer on the data pad.

4. The method of claim 3, wherein:
    the gate pad is formed of a same material as the gate line, and
    the data pad is formed of a same material as the data line.

5. The method of claim 3, further comprising:
    patterning the passivation layer and the gate insulating layer to remove a portion of the gate insulating layer and a portion of the passivation layer positioned on the gate pad and another portion of the passivation layer positioned on the data pad, so as to expose the gate pad and the data pad; and
    forming a first auxiliary gate pad on the exposed gate pad and forming a first auxiliary data pad on the exposed data pad.

6. The method of claim 5, wherein:
    the first auxiliary gate pad and the first auxiliary data pad are formed of a same material as the pixel electrode.

7. The method of claim 5, further comprising:
    removing a portion of the sacrificial layer positioned on each of the first auxiliary gate pad and the first auxiliary data pad by patterning the sacrificial layer.

8. The method of claim 7, further comprising:
    forming a second auxiliary gate pad on the first auxiliary gate pad and forming a second auxiliary data pad on the first auxiliary data pad, wherein the second auxiliary gate pad and the second auxiliary data pad are formed in a same process step as the common electrode.

9. The method of claim 8, wherein:
    the second auxiliary gate pad and the second auxiliary data pad are formed of a same material as the common electrode.

10. The method of claim 8, further comprising:
    forming a first insulating layer on the pixel electrode and the light blocking member, and
    removing a portion of the first insulating layer positioned on each of the first auxiliary gate pad and the first auxiliary data pad.

11. The method of claim 10, further comprising:
    forming a second insulating layer on the common electrode, the second auxiliary gate pad, and the second auxiliary data pad;
    forming a third insulating layer on the roof layer and the second insulating layer; and
    removing a portion of the second insulating layer and the third insulating layer positioned on each of the second auxiliary gate pad and the second auxiliary data pad by patterning the second insulating layer and the third insulating layer.

12. The method of claim 7, wherein:
    forming the common electrode on the gate pad and the data pad;
    forming the second insulating layer on the common electrode; and
    forming the third insulating layer on the roof layer and the second insulating layer.

13. The method of claim 12, further comprising:
    removing a portion of the common electrode, the second insulating layer, and the third insulating layer positioned on each of the first auxiliary gate pad and the second auxiliary data pad by patterning the common electrode, the second insulating layer, and the third insulating layer.

14. The method of claim 1, wherein ashing the sacrificial layer further comprises removing a portion of the sacrificial layer positioned on the light blocking member.

* * * * *